United States Patent
Sayre et al.

(10) Patent No.: US 9,379,644 B2
(45) Date of Patent: Jun. 28, 2016

(54) ELECTROACTIVE POLYMER (EAP)-BASED ROTARY MOTION DEVICES

(75) Inventors: Jay Sayre, New Albany, OH (US); Mark Stasik, Columbus, OH (US); Chuck Plaxico, Canton, ME (US); Megan Moore, Hilliard, OH (US); Vincent D. McGinniss, Columbus, OH (US); James Kennedy, Worthington, OH (US)

(73) Assignee: Battelle Memorial Institute, Columbus, OH (US)

( * ) Notice: Subject to any disclaimer, the term of this patent is extended or adjusted under 35 U.S.C. 154(b) by 0 days.

(21) Appl. No.: 13/806,844

(22) PCT Filed: Jun. 23, 2011

(86) PCT No.: PCT/US2011/041708
§ 371 (c)(1),
(2), (4) Date: Mar. 5, 2013

(87) PCT Pub. No.: WO2011/163530
PCT Pub. Date: Dec. 29, 2011

(65) Prior Publication Data
US 2013/0192910 A1 Aug. 1, 2013

Related U.S. Application Data

(60) Provisional application No. 61/358,439, filed on Jun. 25, 2010.

(51) Int. Cl.
*B60B 9/26* (2006.01)
*H02N 2/10* (2006.01)
(Continued)

(52) U.S. Cl.
CPC . *H02N 2/105* (2013.01); *B25J 9/00* (2013.01); *B25J 9/1095* (2013.01); *B25J 18/00* (2013.01);
(Continued)

(58) Field of Classification Search
CPC .................................. H01L 41/08; B60B 9/26
USPC ............. 180/65.1, 65.21; 310/328, 339, 800, 310/363
See application file for complete search history.

(56) References Cited

U.S. PATENT DOCUMENTS 4,945,962 A * 8/1990 Pajtas ................................ 152/7
6,194,815 B1 * 2/2001 Carroll .......................... 310/339
(Continued)

FOREIGN PATENT DOCUMENTS

EP 1894748 A1 3/2008
WO 2008118983 A1 10/2008

OTHER PUBLICATIONS

Written opinion and international search report from related PCT Application No. PCT/US2011/041708.

*Primary Examiner* — Hau Phan
(74) *Attorney, Agent, or Firm* — Benesch Friedlander Coplan & Aronoff LLP; Benjamen E. Kern; Kraig K. Anderson

(57) ABSTRACT

Rotary motion devices (10) are provided. In one embodiment, the rotary motion devices (10) may comprise: a mass (12); a circumferential component (14); a plurality of spokes (16) connecting the mass (12) to the circumferential component (14), at least one of the spokes (16) comprising an electroactive polymer, wherein: the at least one spoke (16) has at least one input electrode and is configured to deflect upon application of an electrical potential across the at least one input electrode, and the rotary motion device (10) is configured such that deflection of the at least one spoke (16) causes the mass (12) to move, thereby causing the rotary motion device (10) to become off balance with respect to gravity, and rotate.

11 Claims, 18 Drawing Sheets

Position 1

Position 2

(51) Int. Cl.

| | | |
|---|---|---|
| *B25J 9/00* | (2006.01) | |
| *B25J 9/10* | (2006.01) | |
| *F04D 25/06* | (2006.01) | |
| *F16H 19/00* | (2006.01) | |
| *F16H 21/00* | (2006.01) | |
| *H01L 41/09* | (2006.01) | |
| *H01L 41/193* | (2006.01) | |
| *H02N 11/00* | (2006.01) | |
| *B25J 18/00* | (2006.01) | |
| *B60K 7/00* | (2006.01) | |
| *F04D 13/06* | (2006.01) | |
| *F16H 19/04* | (2006.01) | |
| *F16H 21/18* | (2006.01) | |
| *G05G 5/04* | (2006.01) | |

(52) U.S. Cl.
CPC ............... *B60B 9/26* (2013.01); *B60K 7/0007* (2013.01); *F04D 13/06* (2013.01); *F04D 25/06* (2013.01); *F04D 25/0606* (2013.01); *F16H 19/00* (2013.01); *F16H 19/04* (2013.01); *F16H 21/00* (2013.01); *F16H 21/18* (2013.01); *G05G 5/04* (2013.01); *H01L 41/09* (2013.01); *H01L 41/193* (2013.01); *H02N 2/10* (2013.01); *H02N 11/006* (2013.01); *B60B 2900/911* (2013.01); *Y10T 74/18184* (2015.01); *Y10T 74/18808* (2015.01); *Y10T 74/20317* (2015.01); *Y10T 74/20636* (2015.01)

(56) References Cited

U.S. PATENT DOCUMENTS

| | | | | |
|---|---|---|---|---|
| 6,249,076 | B1 * | 6/2001 | Madden et al. | 310/363 |
| 6,429,576 | B1 * | 8/2002 | Simes | 310/339 |
| 6,806,621 | B2 * | 10/2004 | Heim et al. | 310/328 |
| 7,075,213 | B2 * | 7/2006 | Krill | 310/328 |
| 7,456,549 | B2 * | 11/2008 | Heim et al. | 310/328 |
| 7,705,521 | B2 * | 4/2010 | Pelrine et al. | 310/328 |
| 7,772,746 | B2 * | 8/2010 | Keolian | H02N 2/18 310/324 |
| 8,027,096 | B2 * | 9/2011 | Feng et al. | 359/666 |
| 8,395,300 | B2 * | 3/2013 | Aabloo et al. | 310/328 |
| 8,450,909 | B2 * | 5/2013 | Lee et al. | 310/339 |
| 2005/0162049 | A1 | 7/2005 | Krill | |

* cited by examiner

Initial Position

Apply Voltage

ELECTROACTIVE POLYMER (EAP)-BASED ROTARY MOTION DEVICES

CROSS-REFERENCE TO RELATED APPLICATIONS

This application claims priority from U.S. Provisional Patent Application No. 61/358,439, filed on Jun. 25, 2010, which is incorporated by reference herein in its entirety.

BACKGROUND

Rotary motion devices are commonplace articles in various industries and in everyday life. One example of a rotary motion device is a rotary motor. A rotary motor converts from an input energy (e.g., electrical energy applied to a coil) to mechanical energy. Typically, the mechanical energy is output as rotary motion of a shaft.

Rotary motion devices are not limited to motors. Indeed, rotary motion may be defined simply as motion in a circle. Thus, well known rotary motion devices may also include, for example, devices that convert: rotary motion to linear motion, such as via wheels or a rack and pinion; rotary motion to reciprocating motion, such as via a piston, a geared mechanism, or a Cardan gear; rotary motion to oscillation, such as via a crank or quick return; rotary motion to intermittent motion, such as via a Geneva stop; and rotary motion to irregular motion, such as via a cam. Rotary motion devices are also commonplace in several other applications, including, for example, medical, space, robotic, and biomimetic applications, micro-electro-mechanical systems (MEMS), entertainment devices, and devices requiring vibration sensing.

Traditional rotary motion devices are often heavy, bulky, and unsuitable for many applications, such as those requiring light weight, continuous output, or both. More recent advances address certain of these drawbacks, and include the use of electroactive polymers ("EAP"s). EAPs convert between input energy and mechanical energy. In the context of a rotary motor, a voltage is applied to electrodes contacting an EAP, causing the EAP to deflect. This deflection is converted into rotary motion, namely, rotation of a power output shaft. Repeated deflection of the polymer may produce continuous rotation of the power shaft.

Known uses of EAPs for rotary motion devices have been primarily limited to linear deflection of EAPs and/or a device construction that must overcome both the resistance of the article upon which work is being performed (e.g., the turning resistance of a motor shaft) and the force of gravity (e.g., pulling the weight of a motor crank arm against gravity).

The present embodiments disclose the use of EAPs in rotary motion devices that may overcome one or more of the limitations of traditional rotary motion devices and known EAP-based rotary motion devices.

SUMMARY

In one embodiment, a rotary motion device is provided, the rotary motion device comprising: a mass; a circumferential component; a plurality of spokes connecting the mass to the circumferential component, at least one of the spokes comprising an electroactive polymer, wherein: the at least one spoke has at least one input electrode and is configured to deflect upon application of an electrical potential across the at least one input electrode, and the rotary motion device is configured such that deflection of the at least one spoke causes the mass to move, thereby causing the rotary motion device to become off balance with respect to gravity, and rotate.

In another embodiment, an EAP-powered fan is provided, the fan comprising: an axle; a mass configured to rotate about the axle; a circumferential component having at least one blade extending outwardly; a plurality of spokes connecting the mass to the circumferential component, at least one of the spokes comprising an electroactive polymer, wherein: the at least one spoke has at least one input electrode and is configured to deflect upon application of an electrical potential across the at least one input electrode, and the fan is configured such that deflection of the at least one spoke causes the mass to move, thereby causing the fan to become off balance with respect to gravity, and rotate about the axle.

In another embodiment, payload transport systems are provided. In one embodiment of a payload transport system, the payload transport system may comprise: a mass; a circumferential component; a plurality of spokes connecting the mass to the circumferential component, at least one of the spokes comprising an electroactive polymer, wherein: the at least one spoke has at least one input electrode and is configured to deflect upon application of an electrical potential across the at least one input electrode, and the payload transport system is configured such that deflection of the at least one spoke causes the mass to move, thereby causing the payload transport system to become off balance with respect to gravity, and roll.

In another embodiment, the payload transport system may comprise: (1) at least a first wheel and a second wheel, each said wheel comprising: (a) a mass; (b) a circumferential component; and (c) a plurality of spokes connecting the mass to the circumferential component, at least one of the spokes comprising an electroactive polymer, wherein: the at least one spoke has at least one input electrode and is configured to deflect upon application of an electrical potential across the at least one input electrode, and each said wheel is configured such that deflection of the at least one spoke causes the mass to move, thereby causing each said wheel to become off balance with respect to gravity, and roll; (2) an axle connecting the first wheel to the second wheel and about which the first wheel and the second wheel rotate; and (3) a platform connected to the axle, configured to support a payload.

In yet another embodiment, a rack and pinion system is provided, the rack and pinion system comprising: (1) a rack, comprising a substantially flat bar having at least one gear tooth; (2) a pinion, comprising: (a) an axle; (b) a mass configured to rotate about the axle; (c) a circumferential component having at least one gear tooth; and (d) a plurality of spokes connecting the mass to the circumferential component, at least one of the spokes comprising an electroactive polymer, wherein: the at least one spoke has at least one input electrode and is configured to deflect upon application of an electrical potential across the at least one input electrode, and the pinion is configured such that deflection of the at least one spoke causes the mass to move, thereby causing the pinion to become off balance with respect to gravity, and rotate about the axle. In one embodiment, the rack and pinion system may be configured such that the at least one gear tooth of the rack and the at least one gear tooth of the circumferential component engage upon rotation of the mass about the axle.

In another embodiment, a device for converting between rotary motion and reciprocating motion is provided, the device comprising: (1) a piston; (2) a roller portion, comprising: (a) an axle; (b) a mass configured to rotate about the axle; (c) a circumferential component; (d) a plurality of spokes connecting the mass to the circumferential component, at least one of the spokes comprising an electroactive polymer, wherein: the at least one spoke has at least one input electrode and is configured to deflect upon application of an electrical potential across the at least one input electrode, and the roller portion is configured such that deflection of the at least one spoke causes the mass to move, thereby causing the roller portion to become off balance with respect to gravity, and rotate about the axle; and (3) a connecting rod connecting the roller portion to the piston. In one embodiment, the rotation of the mass about the axle may cause the connecting rod to force the piston into reciprocating motion.

In another embodiment, a crank system is provided, the crank system comprising: (1) a pivot point; (2) a shaft configured to pivot about the pivot point; (3) a roller portion, comprising: (a) an axle; (b) a mass configured to rotate about the axle; (c) a circumferential component; and (d) a plurality of spokes connecting the mass to the circumferential component, at least one of the spokes comprising an electroactive polymer, wherein: the at least one spoke has at least one input electrode and is configured to deflect upon application of an electrical potential across the at least one input electrode, and the roller portion is configured such that deflection of the at least one spoke causes the mass to move, thereby causing the roller portion to become off balance with respect to gravity, and rotate about the axle; and (4) a connecting rod connecting the roller portion to the shaft. In one embodiment, the rotation of the mass about the axle causes the connecting rod to force the shaft to pivot about the pivot point.

In another embodiment, a robotic arm system is provided, the robotic arm system comprising: (1) at least two rollers, each said roller comprising: (a) an axle; (b) a mass configured to rotate about the axle; (c) a circumferential component; (d) a plurality of spokes connecting the mass to the circumferential component, at least one of the spokes comprising an electroactive polymer, wherein: the at least one spoke has at least one input electrode and is configured to deflect upon application of an electrical potential across the at least one input electrode, and each said roller is configured such that deflection of the at least one spoke causes the mass to move, thereby causing each said roller to become off balance with respect to gravity, and rotate about the axle; (2) a rotatable arm; and (3) a connector to connect the rotatable arm to the rollers. In one embodiment, the rotation of the rollers causes the rotatable arm to rotate.

In another embodiment, a Geneva stop system is provided, the Geneva stop system comprising: (1) a roller, comprising: (a) an axle; (b) a mass configured to rotate about the axle; (c) a circumferential component comprising a pin and a crescent guard; and (d) a plurality of spokes connecting the mass to the circumferential component, at least one of the spokes comprising an electroactive polymer, wherein: the at least one spoke has at least one input electrode and is configured to deflect upon application of an electrical potential across the at least one input electrode, and the roller is configured such that deflection of the at least one spoke causes the mass to move, thereby causing the roller to become off balance with respect to gravity, and rotate about the axle; and (2) a cross comprising at least one recess configured to receive the pin. In one embodiment, the rotation of the roller causes the cross to rotate.

In another embodiment, a device for converting between rotary motion and irregular motion is provided, the device comprising: (1) a roller, comprising: (a) an axle; (b) a mass configured to rotate about the axle; (c) a circumferential component; and (d) a plurality of spokes connecting the mass to the circumferential component, at least one of the spokes comprising an electroactive polymer, wherein: the at least one spoke has at least one input electrode and is configured to deflect upon application of an electrical potential across the at least one input electrode, and each said roller is configured such that deflection of the at least one spoke causes the mass to move, thereby causing each said roller to become off balance with respect to gravity, and rotate about each said roller's axle; and (2) a cam follower configured to trace a surface of the roller, wherein the rotation of the roller causes the cam follower to trace the surface of the roller and transmit the rotation of the roller to a mechanism.

The disclosed rotary motion devices may further provide a low power mobility mechanism that can operate silently with few moving parts and can be miniaturized.

BRIEF DESCRIPTION OF THE DRAWINGS

The accompanying figures, which are incorporated in and constitute a part of the specification, illustrate various example systems, methods, results, and so on, and are used merely to illustrate various example embodiments. It should be noted that various components depicted in the figures may not be drawn to scale, and that the various shapes (e.g., rectangular, square) depicted in the figures are presented for purposes of illustration only, and should not be considered in any way as limiting.

DETAILED DESCRIPTION

The present embodiments describe EAP-based rotary motion devices. Generally speaking, EAPs are materials that change shape, or "deflect," in response to an applied voltage.

Multiple embodiments of EAP-based rotary motion devices are disclosed herein in relation to classic mechanical rotary motion devices, because of the ubiquity and ease of understanding of such devices. However, it is fully contemplated that the rotary motion generation concepts disclosed herein are equally applicable to medical, space, robotic, and biomimetic applications, micro-electro-mechanical systems (MEMS), entertainment devices, and devices requiring vibration sensing.

Figure 1:
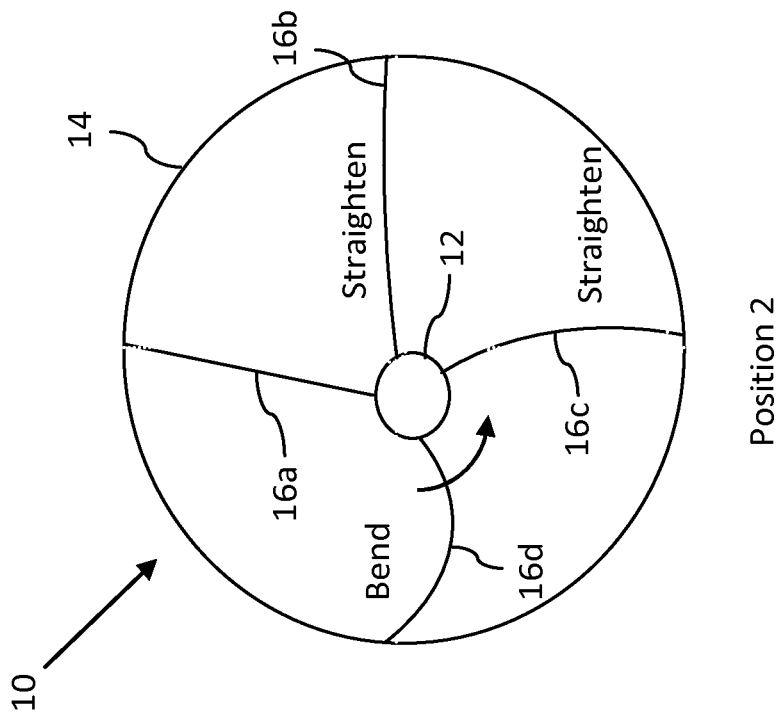
FIG. 1 illustrates an example rotary motion device 10 at a first position and a second position.
Figure 1:
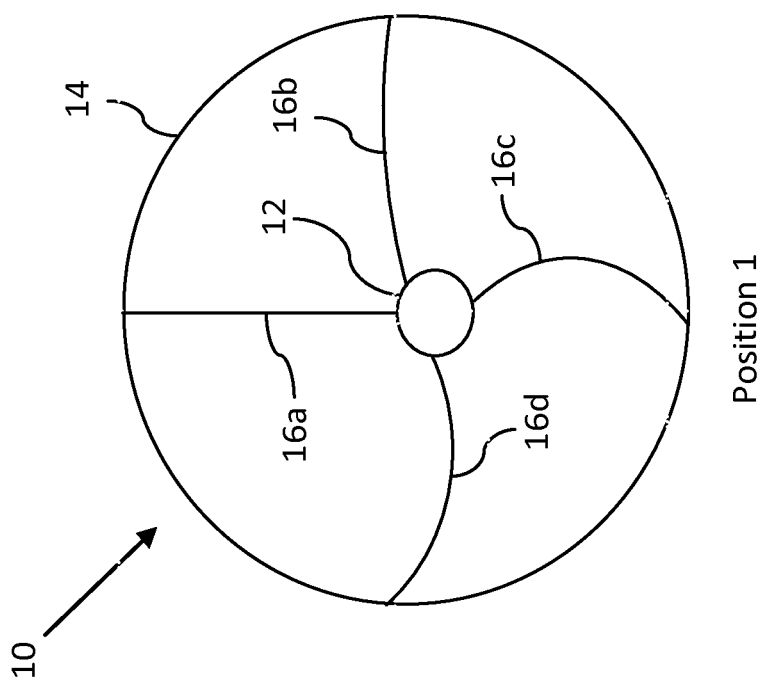

Thus, in a simplest form, shown in FIG. 1, a rotary motion device 10 is disclosed. As shown in FIG. 1, rotary motion device 10 comprises: a mass 12; a circumferential component 14; a plurality of spokes 16a, 16b, 16c, and 16d, each rotatably connecting mass 12 to circumferential component 14, at least one of spokes 16a, 16b, 16c, and 16d comprising an electroactive polymer, wherein: at least one of spokes 16a, 16b, 16c, and 16d has at least one input electrode (not shown; however, for purposes of FIG. 1, each of spokes 16a, 16b, 16c, and 16d should be considered to have a corresponding input electrode), and is configured to bend upon application of an electrical potential across the input electrode(s). Rotary motion device 10 is further configured such that the bending and straightening, hereinafter collectively referred to as deflection, of at least one of spokes 16a-d causes mass 12 to move, thereby causing rotary motion device 10 to become off balance with respect to gravity. The return of mass 12 to an equilibrium position, under the force of gravity, causes rotary motion. Depending upon such factors as the geometry and mass of mass 12, the number and positioning of EAP spokes 16a-d, the diameter of circumferential component 14, the direction of rotation desired, and the rate of rotation desired, one or more of EAP spokes 16a-d is actuated to deflect (i.e., bend and/or straighten), to achieve the desired output of rotary motion device 10. In one embodiment, motion of rotary motion device 10 is achieved through the bending deflection of one or more of EAP spokes 16a-d. In another embodiment, motion of rotary motion device 10 is achieved through the straightening deflection of one or more of EAP spokes 16a-d. In still another embodiment, motion of rotary motion device 10 is achieved through a combination of the bending deflection and straightening deflection of one or more of EAP spokes 16a-d.

With further reference to FIG. 1, rotary motion device 10 may be considered in its simplest form to be a wheel that is made to move by a perturbation of its center of gravity by shifting mass 12 located at the center of the wheel. "Position 1" illustrates rotary motion device (wheel) 10 in its equilibrium position. In the equilibrium position, mass 12 is suspended by an array of one or more spokes made of EAPs (16a-d). In the equilibrium position, EAP spokes 16a-d hold mass 12 such that it is horizontally aligned with the center of gravity of the circumferential component (i.e., the centerline of the wheel's rim) 14. Actuation and bending of EAP spoke 16d pulls mass 12 away from the centerline ("Position 2"), thereby altering rotary motion device 10's center of gravity. In addition, EAP spokes 16b and 16c can contribute by being actuated in coordination with spoke 16d, such that spokes 16b and 16c straighten as spoke 16d bends to pull mass 12. Rotary motion device 10 rotates about its center counter-clockwise (in the embodiment shown) to move mass 12 back to equilibrium, which is the same basic configuration as Position 1. Thus, it is a novel and inventive feature of one or more of the present embodiments that EAP actuation is used in conjunction with gravity to cause rotation. Repeating this EAP actuation in a choreographed manner would cause rotary motion device 10 to roll continuously. The speed and direction of rotary motion device 10's motion can also be controlled by choreographed actuation of EAP spokes 16a-d.

In an alternative embodiment, rotary motion device 10 comprises a mass 12, a circumferential device 14, and at least one spoke 16a-d. Mass 12 is suspended by spokes 16a-d, at least one of which is an EAP spoke, and at least one of which is a spring or other biasing device. The at least one spring may be biased such that it is in tension when supporting mass 12, and acts to pull mass 12 toward circumferential device 14. In this embodiment, the at least one EAP spoke may be configured to remain actuated such that mass 12 is maintained in an equilibrium position by the EAP spoke. Upon discontinuing the electrical potential across the EAP spoke's input electrode, the EAP spoke is allowed to straighten, causing the at least one spring to pull mass 12 away from the centerline. The resulting imbalance causes rotary motion device 10 to move. In another alternative embodiment, each of spokes 16a-d are EAP spokes, and each is configured to remain actuated and in tension while mass 12 is in equilibrium. Discontinuing the electrical potential across one or more EAP spoke's input electrode allows that spoke to straighten, resulting in one or more of the remaining EAP spoke's pulling mass 12 away from the centerline and thereby causing rotary motion device 10 to move.

In addition to being able to deflect under an applied voltage, EAPs have the potential to develop a voltage between the electrodes in response to an applied deflection. This characteristic allows EAPs to act as deflection or force sensors. This sensing capability may be used in rotary motion device 10 to determine which EAP spoke is in which position. For example, the full extension of the "top" or 12 o'clock EAP spoke 16a would lead to a baseline, non-deflection signature potential, which would identify it as being in the 12 o'clock position. In addition, the "bottom" or 6 o'clock position EAP 16c would be the most contracted EAP, which would cause it to have a potential with the greatest difference from the baseline signature potential. This would identify it as being in the 6 o'clock position. All of this information together may be used to orient rotary motion device 10 and determine which EAPs to activate in which direction to cause rolling motion in the desired direction.

It is further contemplated that the rotary motion devices disclosed herein, operated in "reverse," may constitute generators. For example, in one embodiment, a generator is simply a motor in reverse; by rotating a shaft, the EAPs may extend or contract, generating a voltage to generate power. Worded alternatively, it is contemplated that the voltage-generating capability of EAPs as used in the rotary motion devices disclosed herein make the devices useful as energy harvesters, in response to applied deflection or force to the EAPs.

EAPs

EAPs are typically categorized into two groups. The first group is known as "ionic," "wet," or "electrochemical" EAPs. The first group deflects as a result of ionic mass transport in response to an applied voltage. The second group is known as "electronic," "dry," or "field-activated" EAPs. This second group deflects in response to an electric field that is created by an applied voltage.

Suitable electronic EAPs may include, for example, ferroelectric polymers (e.g., electron-radiated P(VDF-TrFE), P(VDF-TrFE) terpolymers, and P(VDF-TrFE-CTFE)), dielectric EAPs or electrostatically stricted polymers (e.g., silicon, polyurethane, and polyacrylate), electrostrictive graft elastomers (e.g., copolymer-poly(vinylidene-fluoride-trifluoroethylene)), and liquid crystal elastomers (e.g., polyacrylate and polysiloxane).

Suitable ionic EAPs may include, for example, ionic gels (e.g., PAMPS, poly(vinyl alcohol) gel with dimethyl sulfoxide, and polyacrylonitrile with conductive fibers), conductive polymers (e.g., polypyrrole, polyethylenedioxythiophene, poly-(p-phenylene vinylene), polyaniline, and polythiophene), carbon nanotubes (e.g., single- and multi-walled carbon nanotubes), and electro-rheological fluids (e.g., polymer particles in fluorosilicone base oil).

A specific subset of ionic EAPs includes ionic polymer metal composites (IPMCs), which bend in response to an electrical activation due to cation mobility in the polymer. The base polymers in IPMCs provide channels for mobility of positive ions in a fixed network of negative ions on interconnected clusters. Electrostatic forces and mobile cations are responsible for the bending. Certain IPMCs may have the following beneficial features: (1) low voltage (1-10 V) power requirement; (2) relatively high response (>100 Hz); (3) lack of moving parts; (4) potential for miniaturization; and (5) durability to bending cycles. Base polymers may include, for example, Nafion® (perfluorosulfonate manufactured by Dupont), Flemion® (perfluorocarboxylate manufactured by Asahi Glass, Japan), and Aciplex® (manufactured by Asahi Kasei). Cations may include, for example, tetra-n-butylammonium, lithium cation, and sodium cation. Suitable metals may include, for example, platinum and gold.

Figure 2:
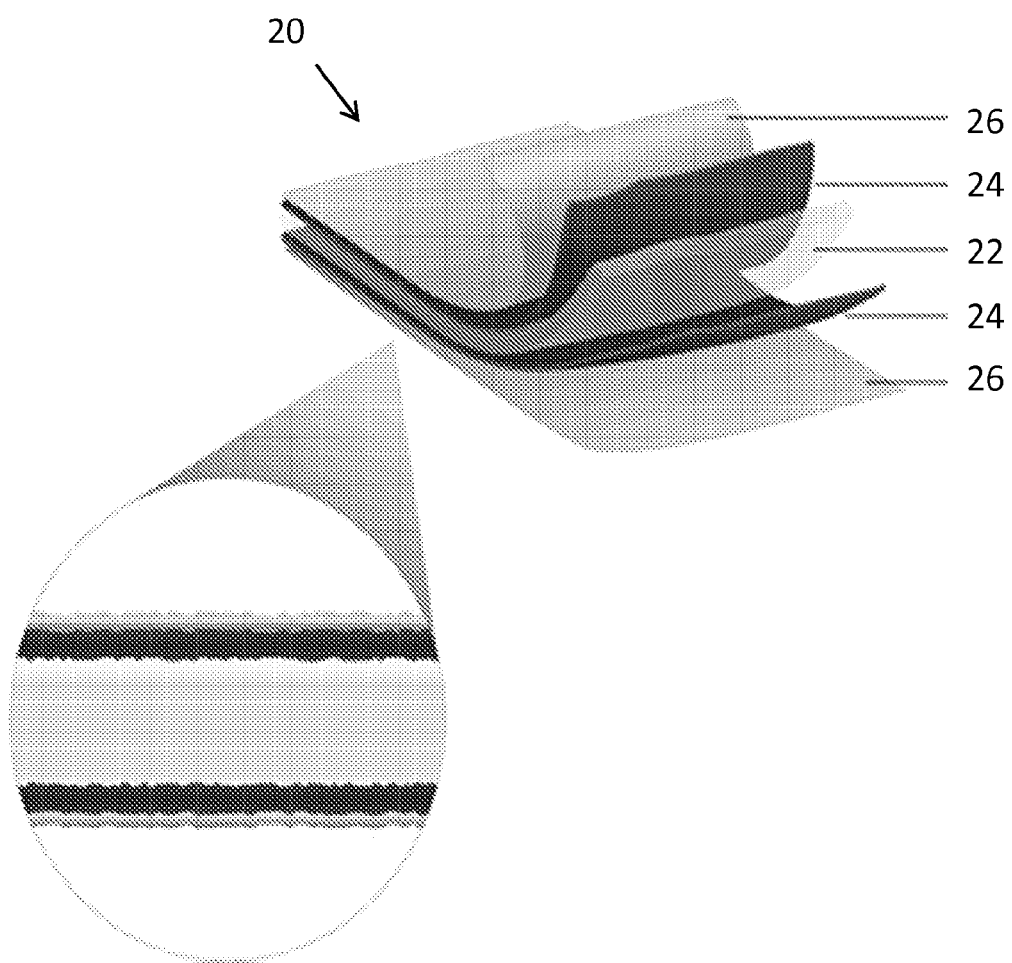
FIG. 2 illustrates a specific embodiment of an IPMC suitable for use in the present embodiments.

FIG. 2 illustrates a specific embodiment of an IPMC suitable for use in the present embodiments. As shown, IPMC 20 comprises a laminate comprising an ionic exchange membrane layer 22, $RuO_2$/ion conducting binder layers 24, and potential distributing layers 26. Details of the actuator fabrication are as follows:

Electrode ink formulation: 0.3 g Ruthenium (IV) oxide, 0.2 g di-$H_2O$, 3.0 g 5 wt % Nafion® solution, and 1.5 g t-butyl alcohol were combined and stirred on a stir-plate overnight.

Electrode fabrication: Glass reinforced polytetrafluoroethylene (PTFE) decals were painted with about 12 layers of the electrode ink under infrared heat. Each layer was dried before applying the next.

Actuator fabrication: The electrodes were pressed on both sides of an N115 Na+ form using a hot press at 410° F. and 500 psig for 3 min, followed by cooling under pressure in the press. Once cooled, the electrodes were removed from the press and the decals were peeled away.

Gold leaf was then applied directly to the electrodes without binder or solvent, by pressing for 30 seconds at 200° F. in the hot press. Alternatively, an exterior gold coating may be applied to the electrodes by vacuum evaporation. First, the electrodes are argon ion pre-cleaned. 20 nm of chromium is evaporated on the EAP. 100 nm of gold is evaporated on top of the chromium. The process is repeated on the other side of the EAP.

Figure 3:
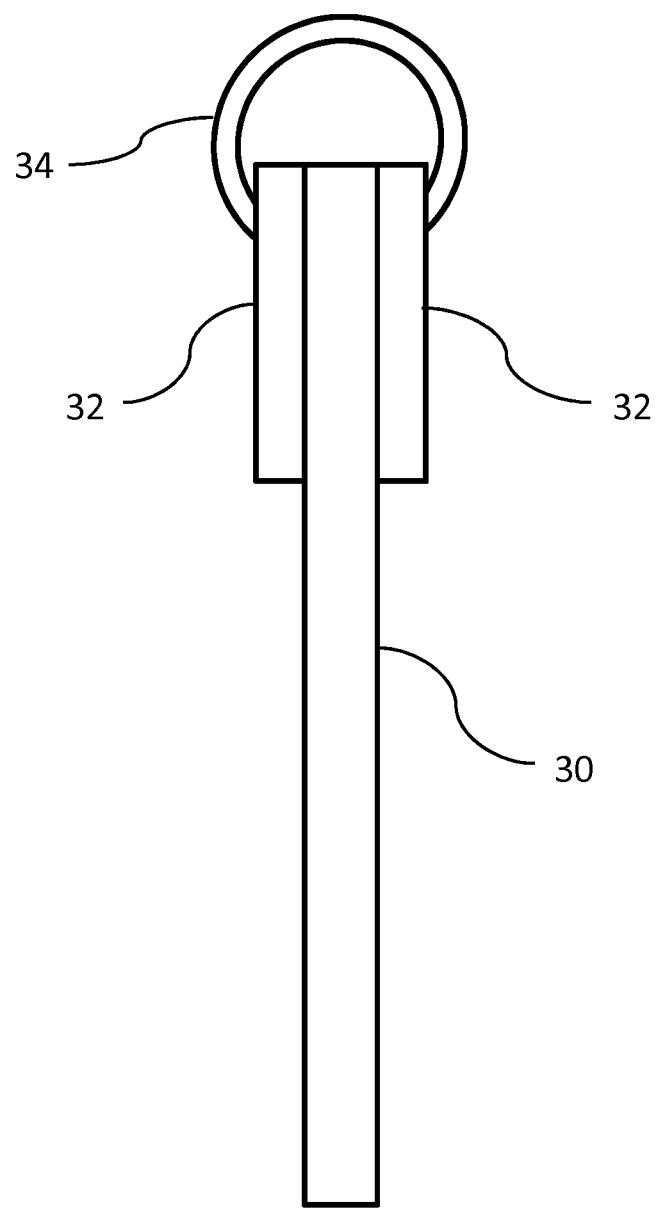
FIG. 3 illustrates an example configuration of an actuator 30, electrodes 32, and an electrode clamp 34.
Figure 4A:
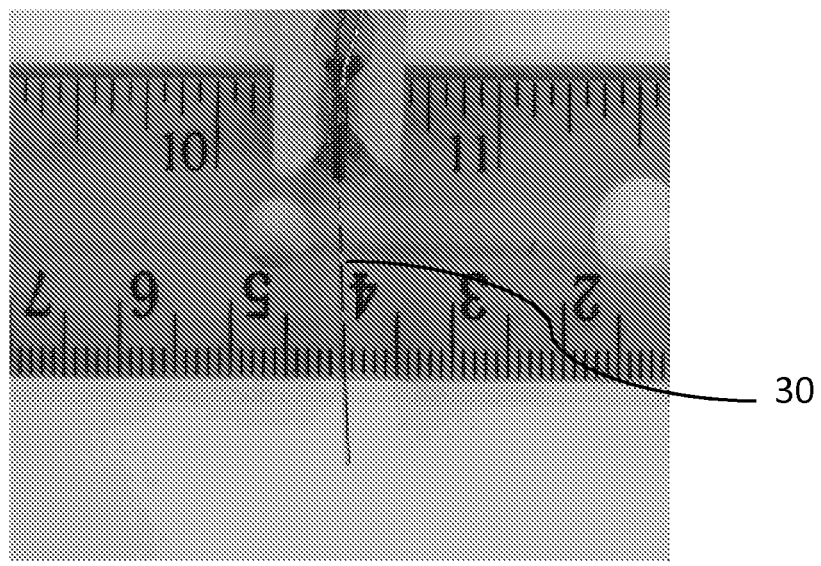
FIG. 4a illustrates actuator 30 in its initial position before applying voltage.
Figure 4B:
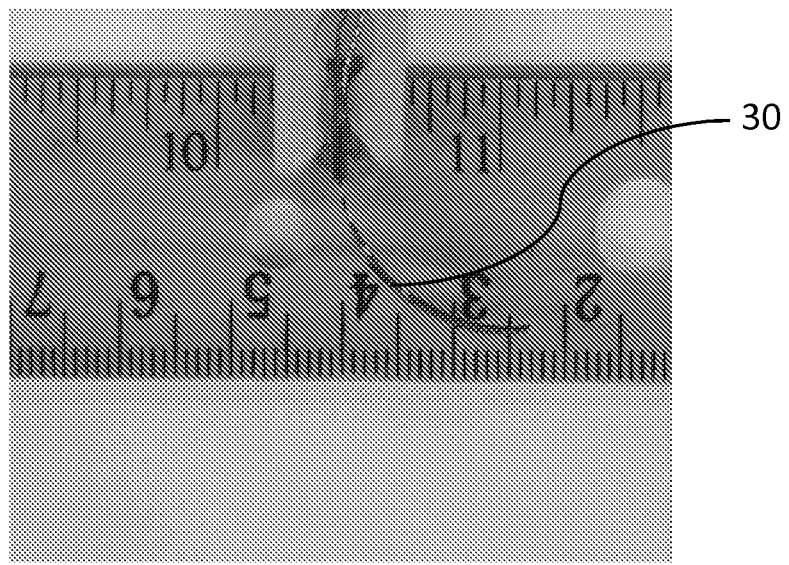
FIG. 4b illustrates actuator 30 during the application of voltage.
Figure 5:
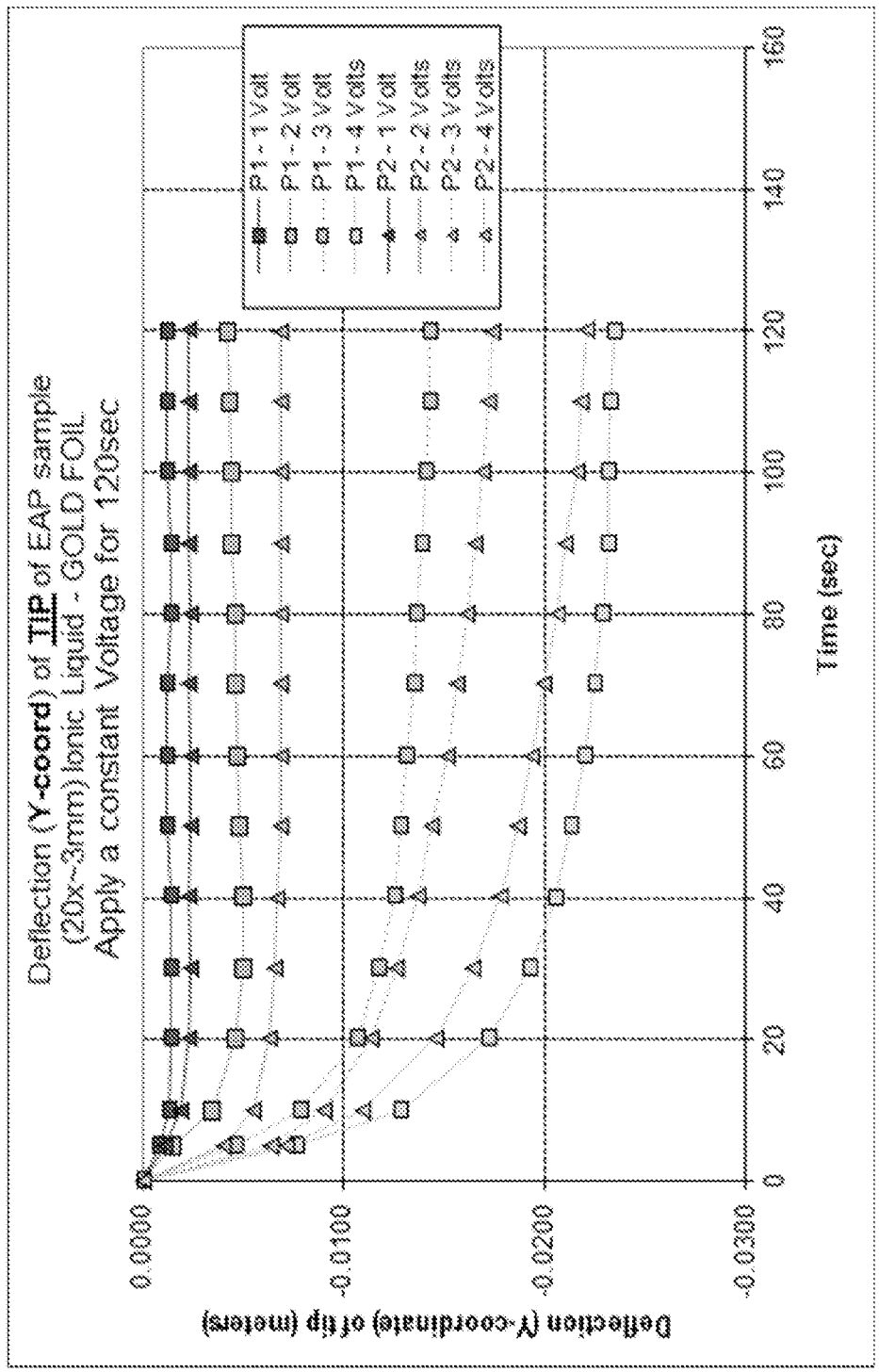
FIG. 5 illustrates deflection versus time data for an actuator of type 30 with ionic liquid solvent.

Experimental tests were run on example actuators of the type shown in FIG. 2 to characterize the magnitude and speed of deflection that result from applied voltages from 1-4V. FIG. 3 illustrates an example configuration of an actuator 30, electrodes 32, and an electrode clamp 34. FIG. 4a illustrates actuator 30 in its initial position before applying voltage. FIG. 4b illustrates actuator 30 during the application of voltage. FIG. 5 illustrates deflection versus time data for an actuator of type 30 with ionic liquid solvent. Ionic liquid solvents may be particularly suitable for facilitating deflection. The actuator 30 used to generate the results shown in FIG. 5 had the dimensions 20 mm×3 mm.

Figure 6:
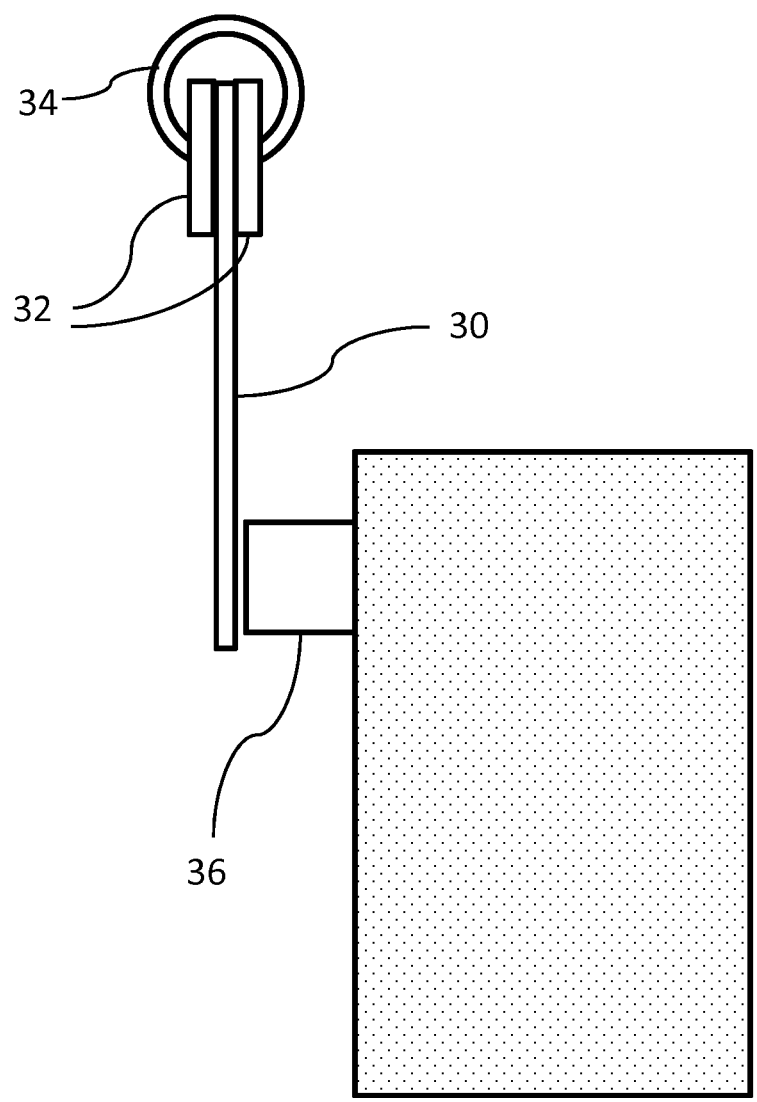
FIG. 6 illustrates an example configuration of actuator 30, electrodes 32, and electrode clamp 34, in a blocked load test set-up.
Figure 7:
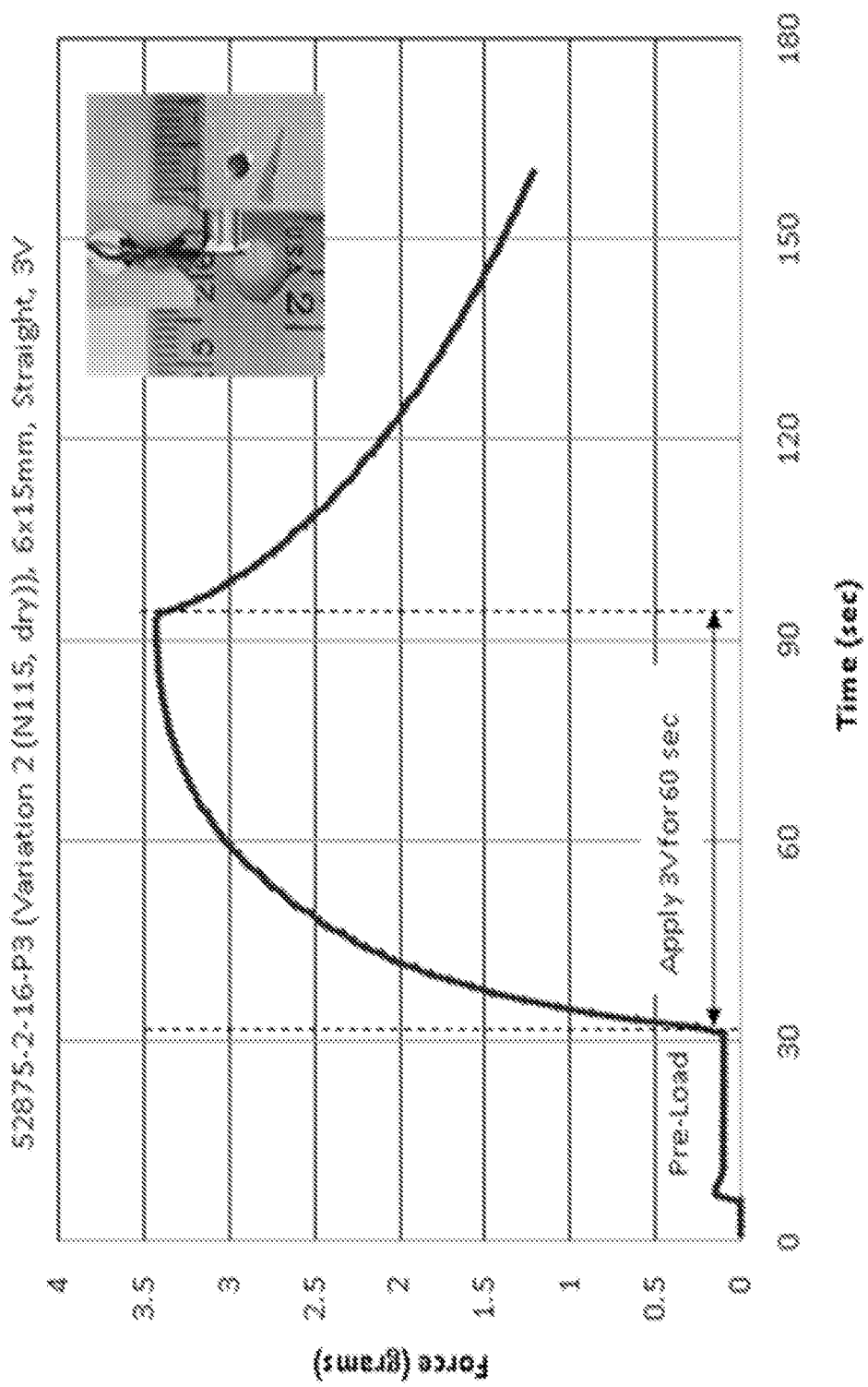
FIG. 7 illustrates the blocked load test data generated via the example configuration shown in FIG. 6.

FIG. 6 illustrates an example configuration of actuator 30, electrodes 32, and electrode clamp 34, in a blocked load test set-up. In this test, actuator 30 was rested against a load cell sensor 36 and activated, so that actuator 30 tried to bend and pushed against sensor 36. FIG. 7 illustrates the blocked force test data. As shown in FIG. 7, a 15 mm×6 mm actuator 30 exerts a force of approximately 3.4 g at 3V.

Other suitable EAPs may be found at Aliev, A. E.; Oh, J.; Kozlov, M. E.; Kuznetsov, A. A.; Fang, S.; Fonseca, A. F.; Ovalle, R.; Lima, M. D.; Hague, M. H.; Gartstein, Y. N.; Zhang, M.; Zakhidov, A. A.; Baughman, R. H., Giant-Stroke, Superelastic Carbon Nanotube Aerogel Muscles. *Science* 2009, 323 (5921), 1575-1578, which is incorporated by reference herein in its entirety. In addition, other types of actuator technologies may be suitable, including, for example, electromagnetic actuators, shape memory alloys (driven by thermal energy), and the like.

Attention will now be turned to a non-exhaustive listing of specific embodiments for which the basic concepts described herein may find use.

Rotary Motion Devices—Fans

Figure 8:
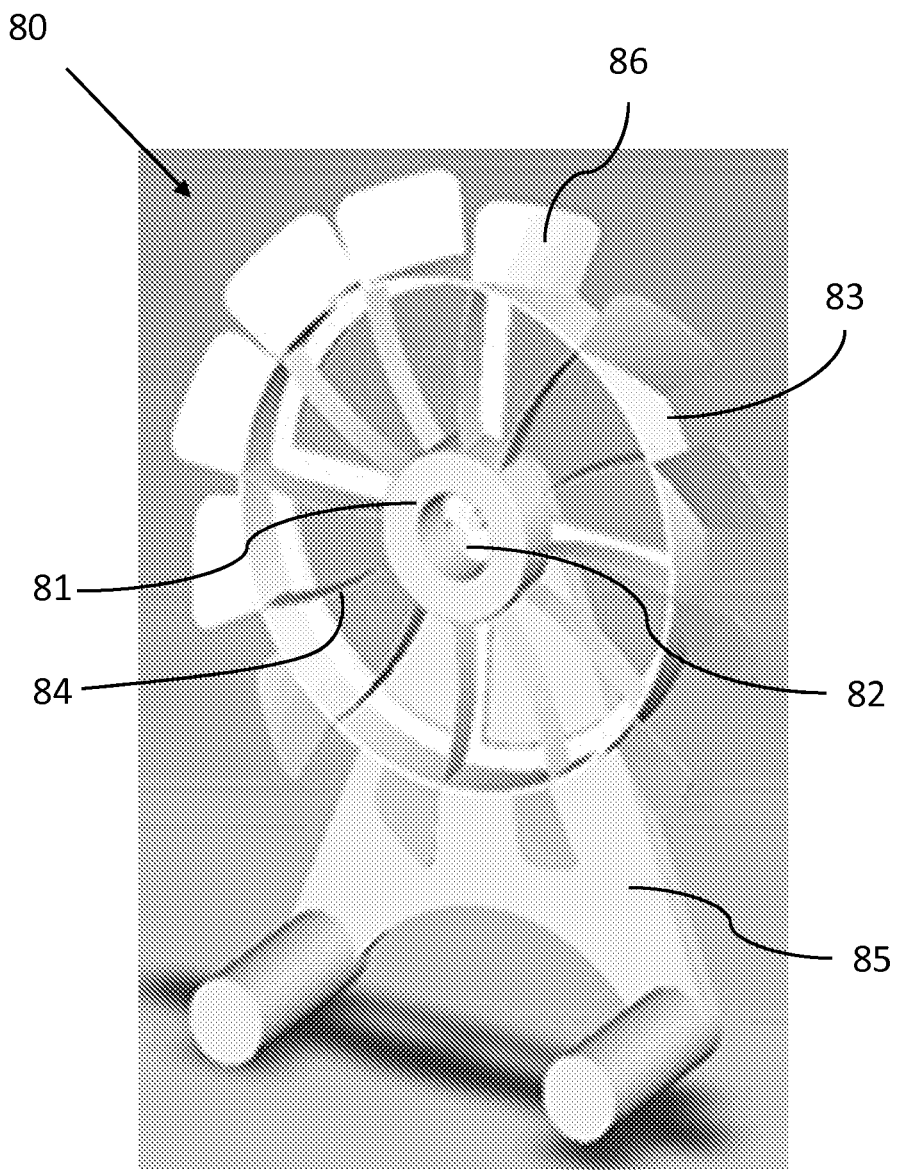
FIG. 8 illustrates an example embodiment of a rotary motion device in the form of a fan 80.

With reference to FIG. 8, in one embodiment, EAPs may be suitable to power a fan 80. As shown in FIG. 8, fan 80 comprises: a mass 81; an axle 82 about which mass 81 is configured to rotate; a circumferential component 83; and a plurality of spokes 84, each rotatably connecting mass 81 to circumferential component 83 (together forming a roller portion of fan 80), at least one of spokes 84 comprising an electroactive polymer, wherein: at least one of spokes 84 has at least one input electrode (not shown; however, for purposes of FIG. 8, each of spokes 84 should be considered to have a corresponding input electrode), and is configured to bend upon application of an electrical potential across the input electrode(s). Likewise, each of spokes 84 may be configured to straighten upon discontinuing application of an electrical potential across the input electrode(s). The roller portion of fan 80 can be supported by a fan base 85. Fan 80 is further configured such that the deflection (i.e., bending and/or straightening) of at least one of spokes 84 causes mass 81 to move out of alignment with the roller portion's center of gravity, thereby causing the roller portion of fan 80 to become off balance with respect to gravity. The return of mass 81 to an equilibrium position, under the force of gravity, causes rotary motion (that is, spinning of the roller portion of fan 80) about axle 82. Fan 80 further comprises outer blades 86 connected to circumferential component 83. In one embodiment, outer blades 86 are inclined. As the inclined plane of blades 86 move through the air, the air ahead of fan 80 is forced forward. Repeated actuation and thus, deflection, of EAP spokes 84 in a choreographed manner causes fan 80 to spin continuously, resulting in a moving air stream. It should be noted that where it is described or claimed herein that a fan spins or rotates about an axle, it is meant that the roller portion of the fan spins or rotates about the axle, not that the fan base, e.g., fan base 85, also spins about the axle.

Rotary Motion Devices—Rotary Motion to Linear Motion

Payload Transport Systems—Wheels

Figure 9:
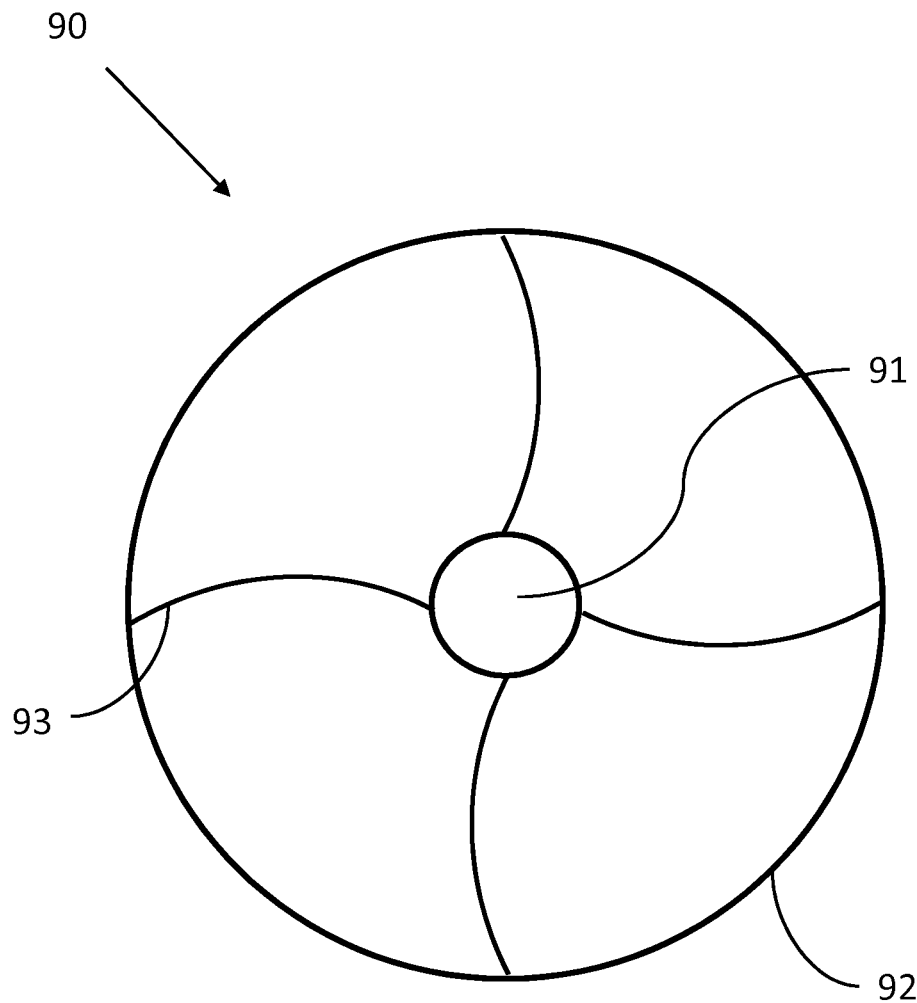
FIG. 9 illustrates an example rotary motion device in the form of a payload transport system 90.

With reference to FIG. 9, in one embodiment, EAPs may be suitable to power a roller or wheel to transport a mass/payload stored at the hub of the wheel. As shown in FIG. 9, mass transport system 90 comprises: a hub 91 which may contain an object having a mass for transport from one location to a second location; a circumferential component (e.g., a circular or cylindrical wheel rim) 92; a plurality of spokes 93, each rotatably connecting hub 91 to circumferential component 92, at least one of spokes 93 comprising an electroactive polymer, wherein: at least one of spokes 93 has at least one input electrode (not shown; however, for purposes of FIG. 9, each of spokes 93 should be considered to have a corresponding input electrode), and is configured to bend upon application of an electrical potential across the input electrode(s). Likewise, each of spokes 93 may be configured to straighten upon discontinuing application of an electrical potential across the input electrode(s). Mass transport system 90 is further configured such that the deflection of at least one of spokes 93 causes payload-containing hub 91 to move, thereby causing mass transport system 90 to become off balance with respect to gravity. The return of payload-containing hub 91 to an equilibrium position, under the force of gravity, causes rotary motion (that is, rolling of mass transport system 90). Repeated actuation of EAP spokes 93 in a choreographed manner causes mass transport system 90 to roll continuously.

It should be noted that hub 91 will, itself, also have a mass. Thus, even when hub 91 is "empty," that is, when hub 91 does not contain a separate mass/payload to be transported, EAP actuation-induced movement of hub 91 causes mass transport system 90 to become off balance with respect to gravity and, as described above, roll. Thus, hub 91 may be loaded with a mass at a first location and rolled to a second location via EAP actuation in conjunction with gravity, as described above. Hub 91 may then be unloaded at the second location and rolled to the original location (or a third location) via EAP actuation in conjunction with gravity, as described above.

Payload Transport Systems—Automobiles

Figure 10A:
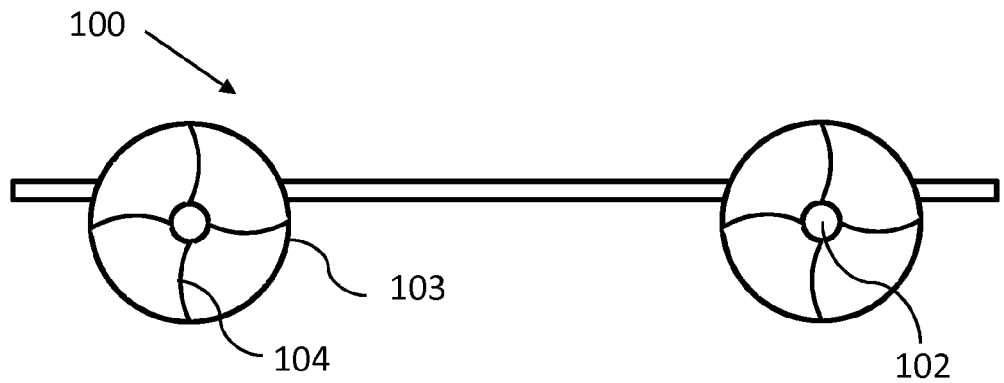
FIG. 10a illustrates a side elevation view of an example rotary motion device in the form of a payload transport system 100.
Figure 10B:
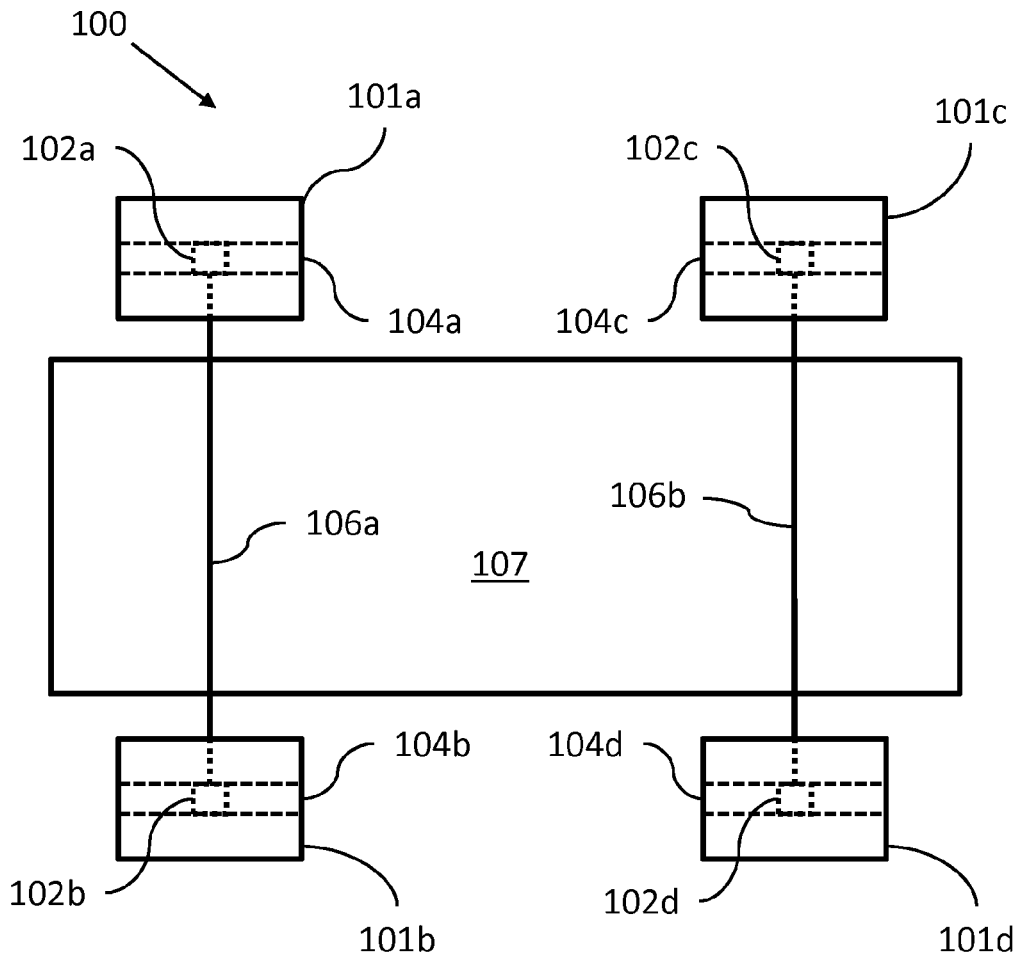
FIG. 10b illustrates a top elevation view of an example rotary motion device in the form of a payload transport system 100.

With reference to FIGS. 10a and 10b, in another embodiment, EAPs may be suitable for use in an automobile configuration to transport a mass/payload. As shown in FIG. 10b, payload transport system 100 comprises four "wheels" 101a, 101b, 101c, 101d. More or fewer wheels 101 are also contemplated. As illustrated in FIG. 10a, each wheel 101 comprises: a mass 102; a circumferential component (i.e., a wheel rim) 103; a plurality of spokes 104, each rotatably connecting mass 102 to circumferential component 103, at least one of spokes 104 comprising an electroactive polymer, wherein: at least one of spokes 104 has at least one input electrode (not shown; however, for purposes of FIGS. 10a and 10b, each of spokes 104 should be considered to have a corresponding input electrode), and is configured to bend upon application of an electrical potential across the input electrode(s). Likewise, each of spokes 104 may be configured to straighten upon discontinuing application of an electrical potential across the input electrode(s). Each wheel 101 is further configured such that the deflection of at least one of spokes 104 causes wheel 101 to move, thereby causing wheel 101 to become off balance with respect to gravity. The return of wheel 101 to an equilibrium position, under the force of gravity, causes rotary motion (that is, rolling of wheel 101). Repeated actuation of EAP spokes 104 in a choreographed manner causes each individual wheel 101 to roll continuously.

As shown in FIG. 10b, payload transport system 100 further comprises two axles 106a and 106b. More or fewer axles 106 are also contemplated. As shown, axle 106a connects wheels 101a and 101b, masses 102a and 102b being rotatably "fixed" upon axle 106a; and axle 106b connects wheels 101c and 101d, masses 102c and 102d being "fixed" upon axle 106b.

As further shown in FIG. 10b, payload transport system 100 further comprises a deck or frame 107 spanning and/or overlapping axles 106a and 106b. Deck or frame 107 may be suitable to support a payload (e.g., property, humans, etc.). Repeating actuation of EAP spokes 104 in a choreographed manner causes wheels 101 to roll continuously and in coordination with each other. Thus, a payload may be loaded on deck or frame 107 and transported from a first location to a second location.

In addition, in one embodiment (not shown), one or more of masses 102 may comprise hubs, which may, in turn, contain a payload, similar to the example wheels 90 shown in FIG. 9.

Payload Transport Systems—Spherical Rollers

Figure 11:
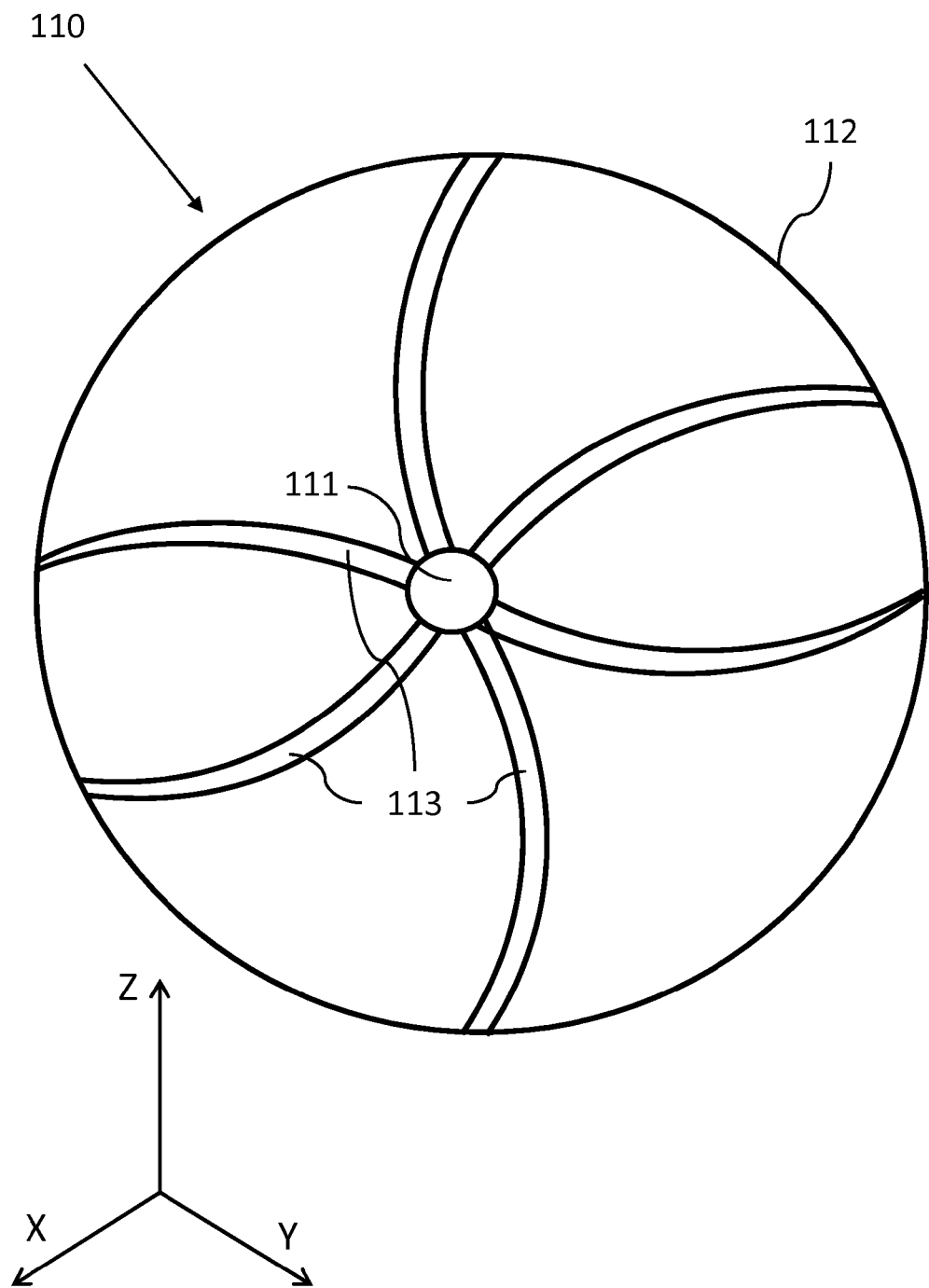
FIG. 11 illustrates an example rotary motion device in the form of a payload transport system 110.

With reference to FIG. 11, in another embodiment, EAPs may be suitable for use as a spherical roller or wheel to transport a mass/payload stored at the hub of the wheel. As shown in FIG. 11, mass transport system 110 comprises: a hub 111 which may contain an object having a mass for transport from one location to a second location; a circumferential component (the sphere) 112; a plurality of spokes 113 radiating in three dimensions, each rotatably connecting hub 111 to circumferential component 112, at least one of spokes 113 comprising an electroactive polymer, wherein: at least one of spokes 113 has at least one input electrode (not shown; however, for purposes of FIG. 11, each of spokes 113 should be considered to have a corresponding input electrode), and is configured to bend upon application of an electrical potential across the input electrode(s). Likewise, each of spokes 113 may be configured to straighten upon discontinuing application of an electrical potential across the input electrode(s). Payload transport system 110 is further configured such that the deflection of at least one of spokes 113 causes payload-containing hub 111 to move, thereby causing payload transport system 110 to become out of alignment with the center of gravity of the payload transport system 110 and thus off balance with respect to gravity. The return of payload-containing hub 111 to an equilibrium position, under the force of gravity, causes rotary motion (that is, rolling of payload transport system 110). Repeated actuation of EAP spokes 113 in a choreographed manner causes payload transport system 110 to roll continuously, in any direction, and allows payload transport system 110 to turn and navigate, and to avoid obstacles.

It should be noted that hub 111 will, itself, also have a mass. Thus, even when hub 111 is "empty," that is, when hub 111 does not contain a separate mass/payload to be transported, EAP actuation-induced movement of hub 111 causes payload transport system 110 to become off balance with respect to gravity and, as described, above, roll. Thus, hub 111 may be loaded with a mass at a first location and rolled, in any direction, to a second location via EAP actuation in conjunction with gravity, as described above. Hub 111 may then be unloaded at the second location and rolled to the original location (or a third location) via EAP actuation in conjunction with gravity, as described above.

Rack and Pinion Systems

Figure 12:
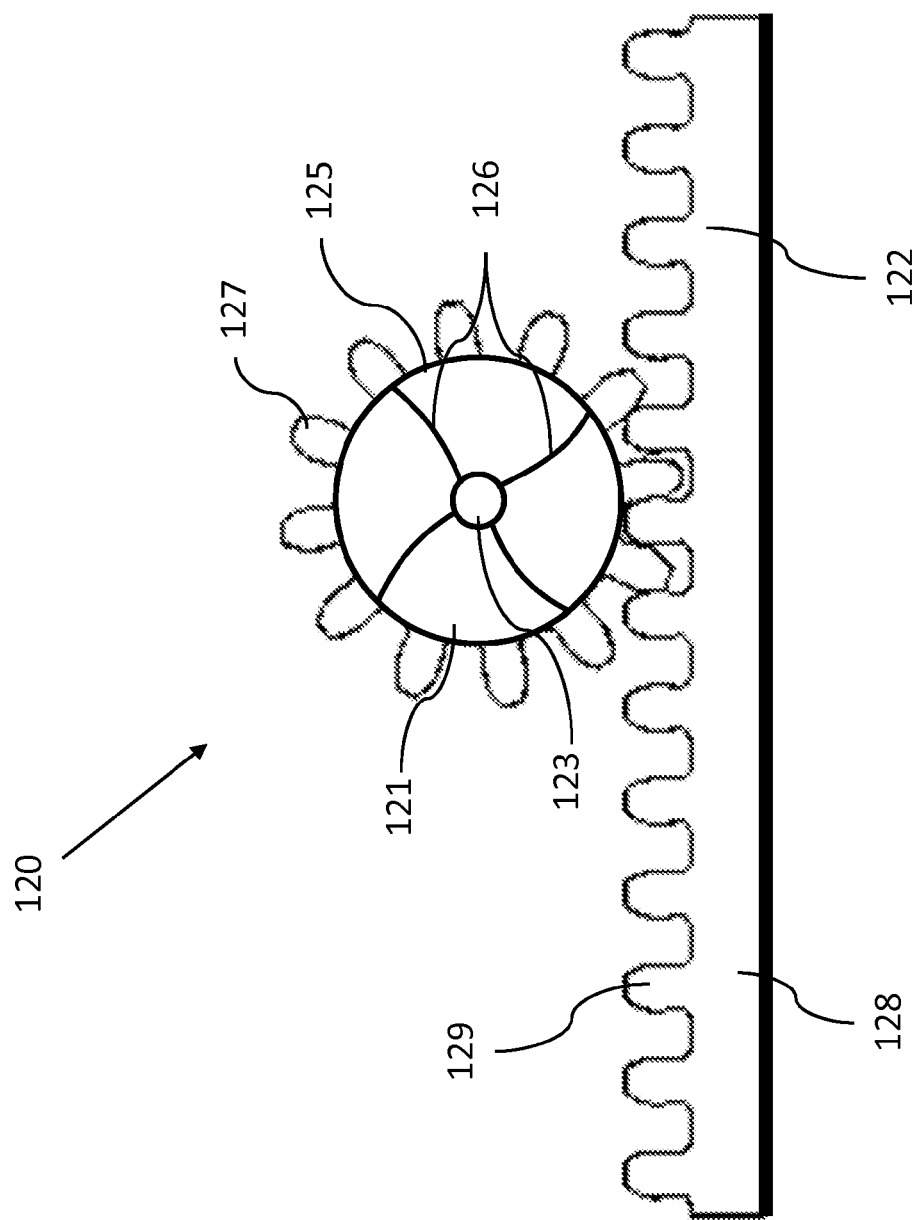
FIG. 12 illustrates an example rotary motion device as a part of a rack and pinion system 120.

With reference to FIG. 12, in one embodiment, EAPs may be suitable for use in rack and pinion systems, e.g., 120. Rack and pinions are commonly used in the steering system of cars to convert the rotary motion of the steering wheel to the side to side motion in the wheels. As shown in FIG. 12, rack and pinion system 120 comprises a pinion portion 121 and a rack portion 122. As shown, pinion portion 121 comprises: a mass 123; an axle (not shown) about which mass 123 is configured to rotate; a circumferential component 125; a plurality of spokes 126, each rotatably connecting mass 123 to circumferential component 125, at least one of spokes 126 comprising an electroactive polymer, wherein: at least one of spokes 126 has at least one input electrode (not shown; however, for purposes of FIG. 12, each of spokes 126 should be considered to have a corresponding input electrode), and is configured to bend upon application of an electrical potential across the input electrode(s). Likewise, each of spokes 126 may be configured to straighten upon discontinuing application of an electrical potential across the input electrode(s). Pinion portion 121 is further configured such that the deflection of at least one of spokes 126 causes mass 123 to move, thereby causing pinion portion 121 to become off balance with respect to gravity. The return of mass 123 to an equilibrium position, under the force of gravity, causes rotary motion (that is, spinning of pinion portion 121) about the axle. Pinion portion 121 further comprises rigid teeth 127. As shown, rack portion 122 comprises a flat bar 128 having rigid teeth 129.

When pinion portion 121 is engaged with rack portion 122, that is, when pinion teeth 127 mesh with rack teeth 129, the choreographed rotation of pinion portion 121 as described above causes rack portion 122 to move from side to side as desired.

Rotary Motion Devices—Rotary Motion to Reciprocating Motion

Piston Mechanisms

Figure 13B:
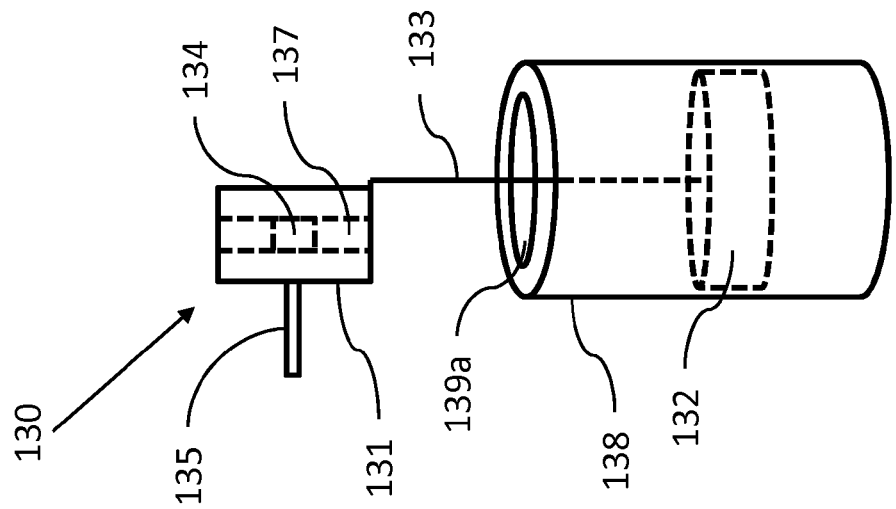
FIG. 13b illustrates a side perspective view of an example rotary motion device as a part of a piston mechanism 130.
Figure 13A:
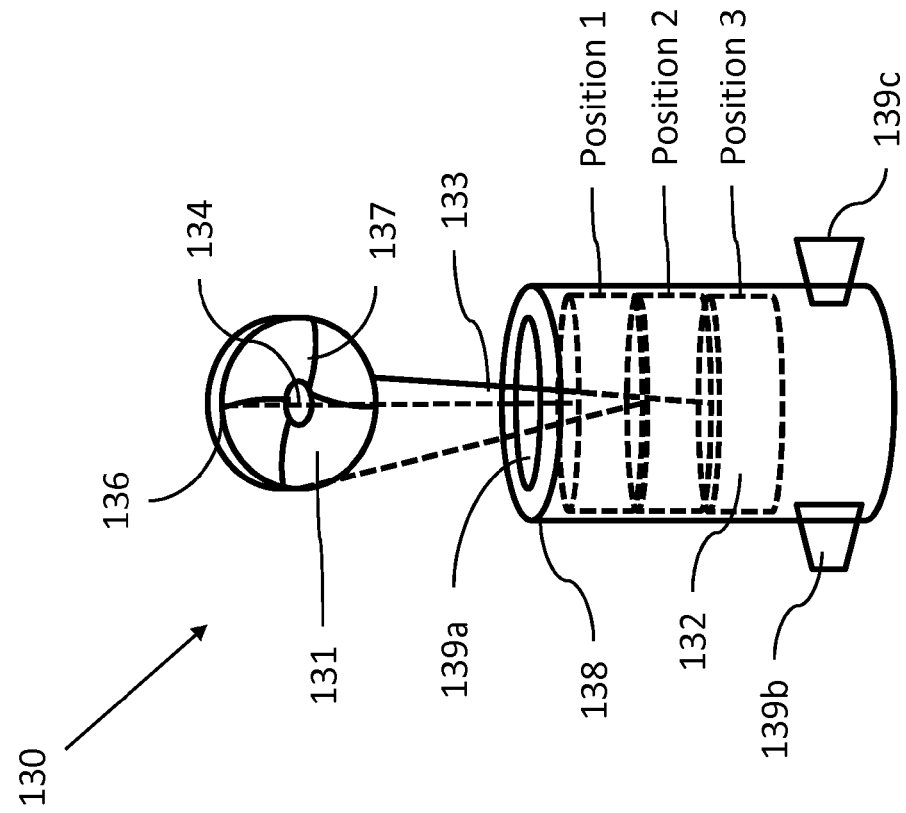
FIG. 13a illustrates a front perspective view of an example rotary motion device as a part of a piston mechanism 130.

With reference to FIGS. 13a and 13b, in one embodiment, EAPs may be suitable to power a piston mechanism, e.g., a piston pump 130, to convert rotary motion to reciprocating motion. As shown in FIGS. 13a and 13b, pump 130 comprises a roller portion 131 and a piston 132, each rotatably connected to the other by a connecting rod 133. As shown, roller portion 131 comprises: a mass 134; an axle 135 about which mass 134 is configured to rotate; a circumferential component 136; a plurality of spokes 137, each rotatably connected to mass 134 and to circumferential component 136, at least one of spokes 137 comprising an electroactive polymer, wherein: at least one of spokes 137 has at least one input electrode (not shown; however, for purposes of FIGS. 13a and 13b, each of spokes 137 should be considered to have a corresponding input electrode), and is configured to bend upon application of an electrical potential across the input electrode(s). Likewise, each of spokes 137 may be configured to straighten upon discontinuing application of an electrical potential across the input electrode(s). Roller portion 131 is further configured such that the deflection of at least one of spokes 137 causes mass 134 to move, thereby causing roller portion 131 to become off balance with respect to gravity. The return of mass 134 to an equilibrium position, under the force of gravity, causes rotary motion (that is, spinning of roller portion 131) about axle 135.

As shown, piston 132 is contained in a housing (e.g., a chamber or cylinder) 138. As shown, housing 138 comprises a connecting rod passageway 139a, an inlet (shown in FIG. 13a as a valve-less conical diffuser) 139b, and an outlet (shown in FIG. 13a as a valve-less conical diffuser) 139c.

As shown, the choreographed rotation of roller portion 131 as described above causes connecting rod 133 to rotate, driving piston 132 back and forth. As illustrated in FIG. 13a, piston 132 can, for example, cycle through Positions 1-3, during rotation of roller portion 131 and the corresponding motion of connecting rod 133. In the case of a piston water pump, the upstroke of piston 132 creates suction, which raises water into chamber 138 through inlet 139b; the downstroke of piston 132 forces water out of outlet 139c. The applicability of the concept described immediately above to a reciprocating internal combustion engine will also be readily apparent to a person having ordinary skill in the art.

Rotary Motion Devices—Rotary Motion to Oscillating Motion

Crank Systems

Figure 14:
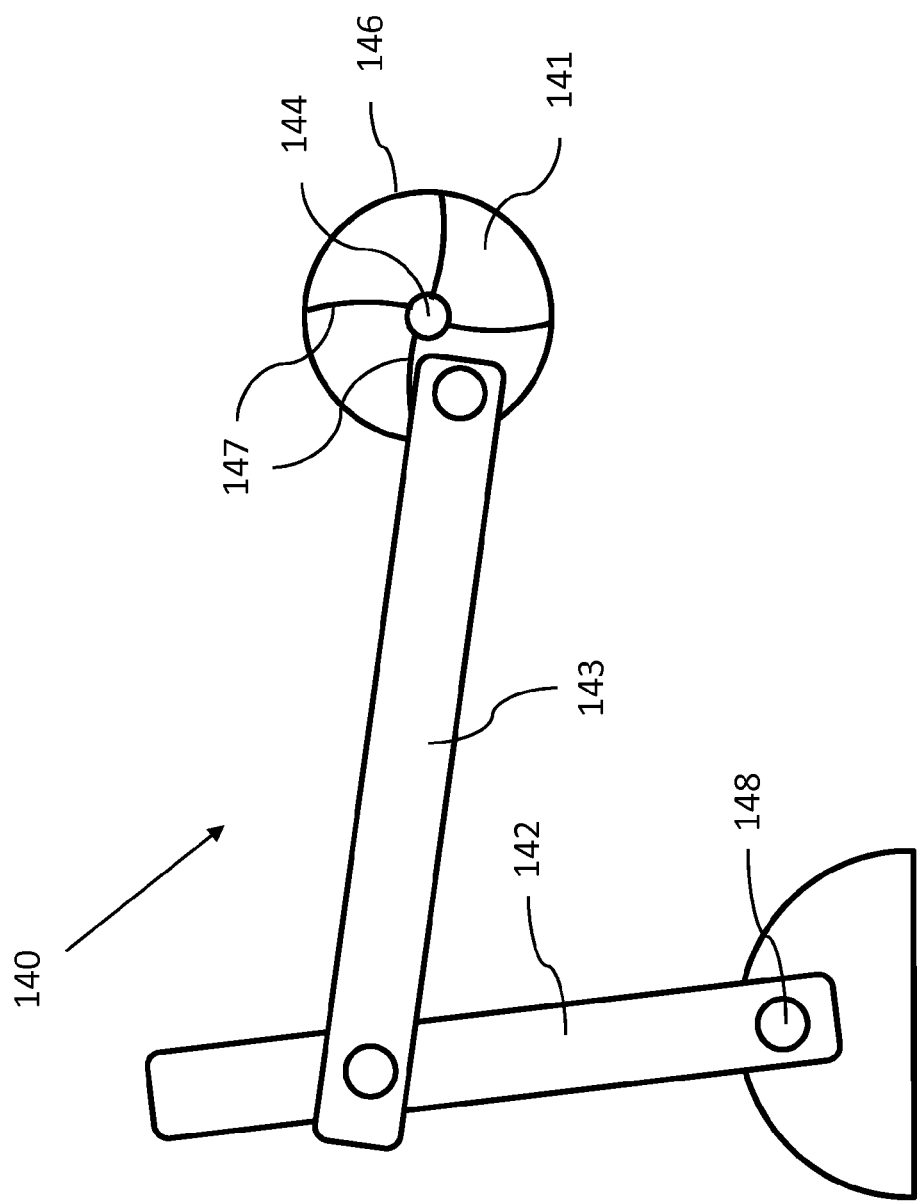
FIG. 14 illustrates an example rotary motion device as a part of a crank system 140.

With reference to FIG. 14, in one embodiment, EAPs may be suitable to power a crank 140 to convert rotary motion to oscillating motion. Oscillating motion is back and forth motion about a pivot point. As shown in FIG. 14, crank 140 comprises a roller portion 141 and a shaft 142, each rotatably connected to the other by a connecting rod 143. As shown, roller portion 141 comprises: a mass 144; an axle (not shown) about which mass 144 is configured to rotate; a circumferential component 146; a plurality of spokes 147, each rotatably connecting mass 144 to circumferential component 146, at least one of spokes 147 comprising an electroactive polymer, wherein: at least one of spokes 147 has at least one input electrode (not shown; however, for purposes of FIG. 14, each of spokes 147 should be considered to have a corresponding input electrode), and is configured to bend upon application of an electrical potential across the input electrode(s). Likewise, each of spokes 147 may be configured to straighten upon discontinuing application of an electrical potential across the input electrode(s). Roller portion 141 is further configured such that the deflection of at least one of spokes 147 causes mass 144 to move, thereby causing roller portion 141 to become off balance with respect to gravity. The return of mass 144 to an equilibrium position, under the force of gravity, causes rotary motion (that is, spinning of roller portion 141) about the axle. As shown, shaft 142 oscillates back and forth about pivot point 148. As shown, the choreographed rotation of roller portion 141 as described above causes connecting rod 143 to rotate, driving shaft 142 back and forth about pivot point 148.

Rotary Motion Devices—Rotary Motion to Intermittent Motion

Geneva Stop Systems

Figure 15:
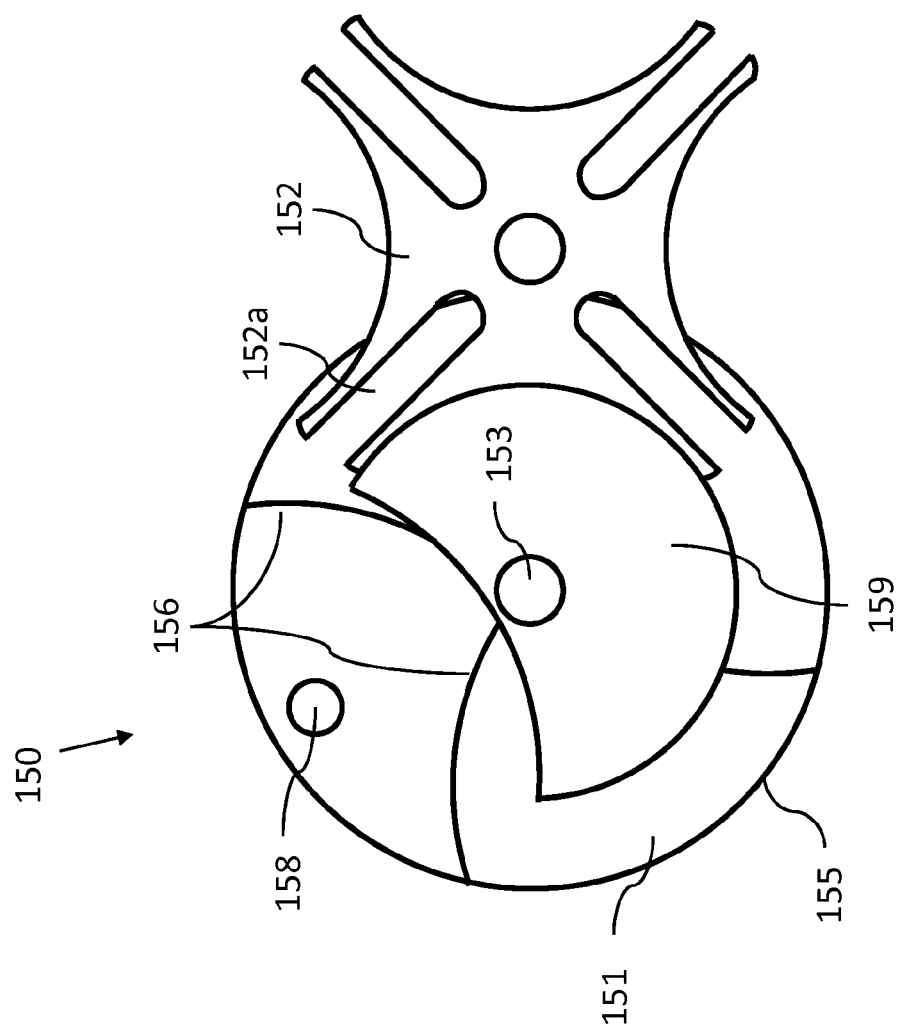
FIG. 15 illustrates an example rotary motion device as a part of a Geneva stop system 150.

With reference to FIG. 15, in one embodiment, EAPs may be suitable to power a Geneva stop 150 to convert rotary motion to intermittent motion. The Geneva stop mechanism is used commonly in, for example, film projectors to advance the film one frame at a time.

As shown in FIG. 15, Geneva stop 150 comprises a roller portion 151 and a cross 152. As shown, roller portion 151 comprises: a mass 153; an axle (not shown) about which mass 153 is configured to rotate; a circumferential component 155; a plurality of spokes 156, each rotatably connecting mass 153 to circumferential component 155, at least one of spokes 156 comprising an electroactive polymer, wherein: at least one of spokes 156 has at least one input electrode (not shown; however, for purposes of FIG. 15, each of spokes 156 should be considered to have a corresponding input electrode), and is configured to bend upon application of an electrical potential across the input electrode(s). Likewise, each of spokes 156 may be configured to straighten upon discontinuing application of an electrical potential across the input electrode(s). Roller portion 151 is further configured such that the deflection of at least one of spokes 156 causes mass 153 to move, thereby causing roller portion 151 to become off balance with respect to gravity. The return of mass 153 to an equilibrium position, under the force of gravity, causes rotary motion (that is, spinning of roller portion 151) about the axle.

As shown, roller portion 151 further comprises a pin 158 connected to circumferential component 155, and a crescent guard 159 fixed about an axle (not shown) and connected to circumferential component 155. As shown, the choreographed rotation of roller portion 151 as described above causes roller portion 151 to turn continuously, causing pin 158 to insert into one of recesses 152a in cross 152. As shown, pin 158 then turns cross 152 one quarter of a turn for each revolution of roller portion 151. Crescent guard 159 allows the points of cross 152 past when pin 158 is inserted into one of recesses 152a, and locks cross 152 in place when pin 158 is free of engagement with any recess 152a.

Rotary Motion Devices—Rotary Motion to Irregular Motion

Cam Systems

Figure 16:
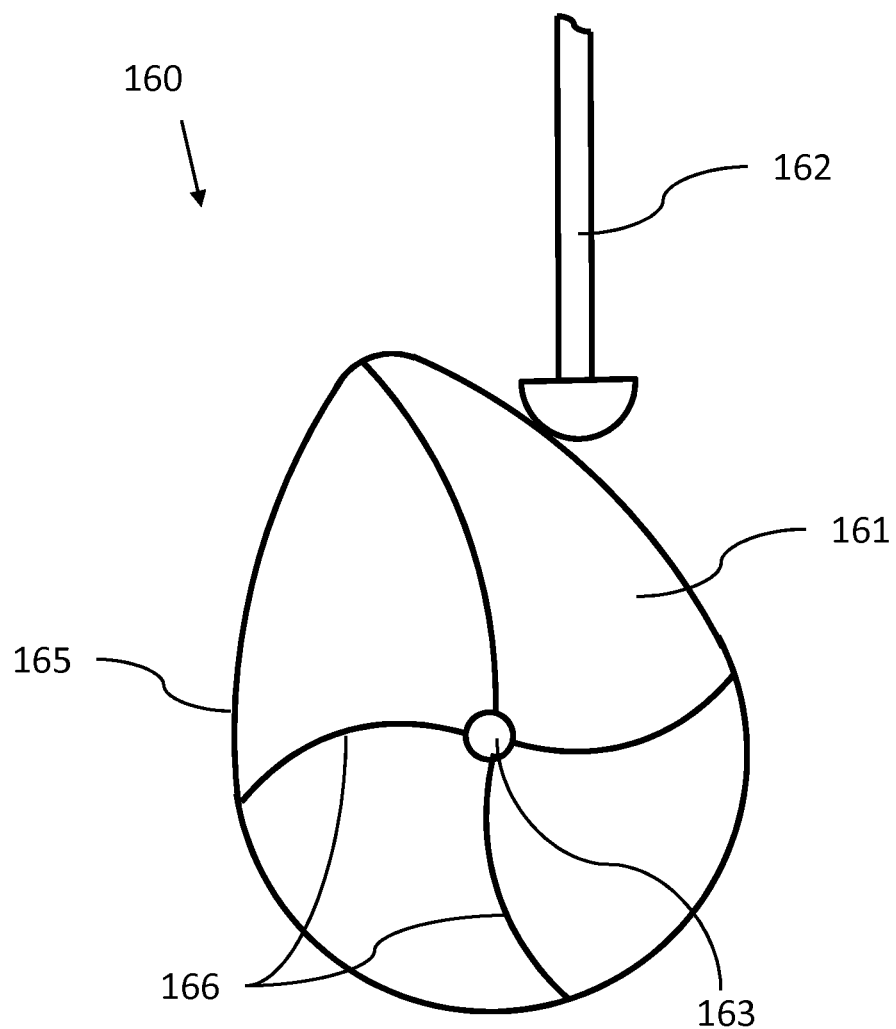
FIG. 16 illustrates an example rotary motion device as a part of a cam system 160.

With reference to FIG. 16, in one embodiment, EAPs may be suitable to power a cam system 160 to convert rotary motion to irregular motion. As shown in FIG. 16, cam system 160 comprises a roller portion (cam) 161 and a cam follower 162. As shown, roller portion 161 comprises: a mass 163; an axle (not shown) about which mass 163 is configured to rotate; a circumferential component 165; a plurality of spokes 166, each rotatably connecting mass 163 to circumferential component 165, at least one of spokes 166 comprising an electroactive polymer, wherein: at least one of spokes 166 has at least one input electrode (not shown; however, for purposes of FIG. 16, each of spokes 166 should be considered to have a corresponding input electrode), and is configured to bend upon application of an electrical potential across the input electrode(s). Likewise, each of spokes 166 may be configured to straighten upon discontinuing application of an electrical potential across the input electrode(s). Roller portion 161 is further configured such that the deflection of at least one of spokes 166 causes mass 163 to move, thereby causing roller portion 161 to become off balance with respect to gravity. The return of mass 163 to an equilibrium position, under the force of gravity, causes rotary motion (that is, spinning of roller portion 161) about the axle.

As shown, the choreographed rotation of roller portion 161 as described above causes roller portion 161 to turn continuously. As roller portion 161 turns, driven by the circular motion, cam follower 162 traces the surface of roller portion 161, transmitting roller portion 161's motion to the required mechanism. In another embodiment, roller portion 161 is configured to oscillate at a desired rate (i.e., turn partially one direction, then the other, rather than turn continuously in a single direction), therein causing cam follower 162 to rise and fall at any frequency and rate desired.

Rotary Motion Devices—Robotic Arm

Figure 17:
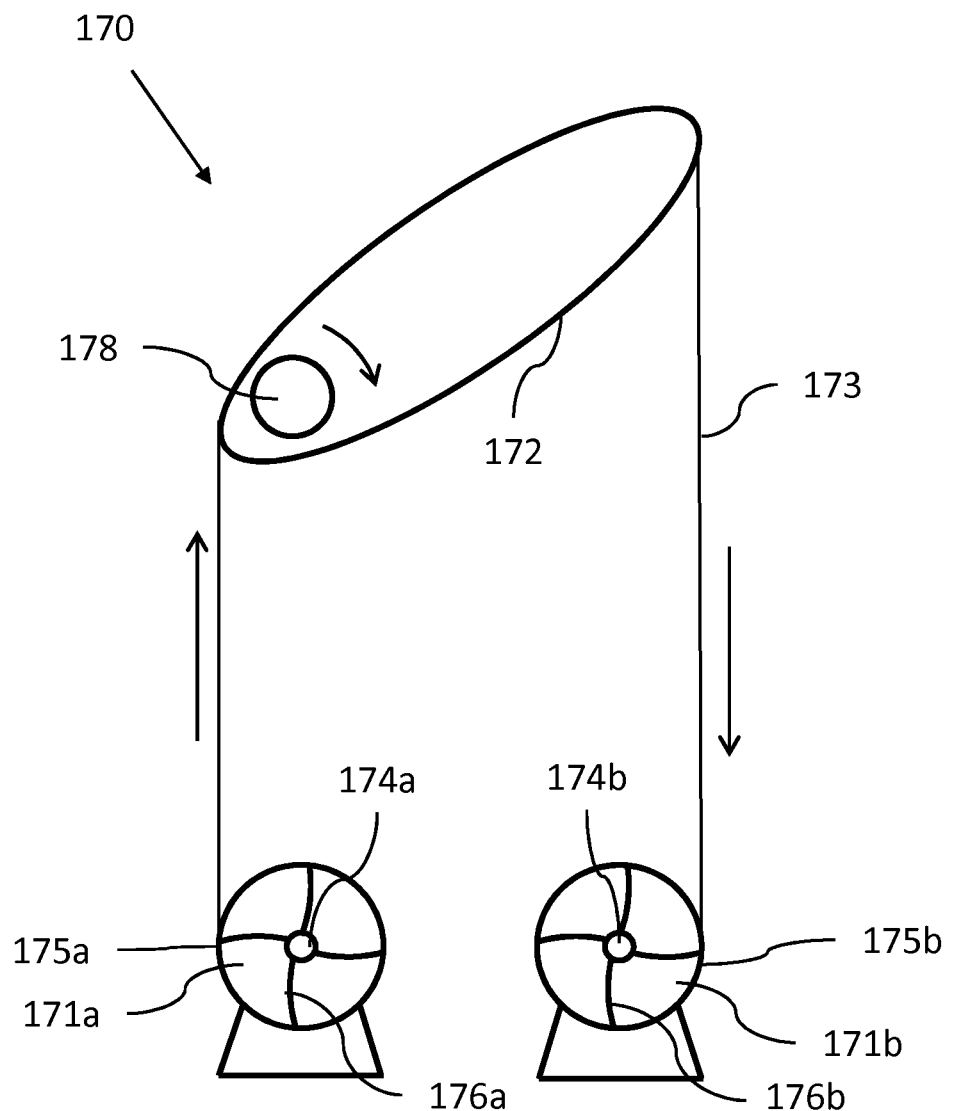
FIG. 17 illustrates an example rotary motion device as a part of a robotic arm system 170.

With reference to FIG. 17, in one embodiment, EAPs may be suitable to power a robotic arm system 170. As shown in FIG. 17, robotic arm system 170 comprises roller portions 171a,b and a robotic arm 172 rotatably connected via a connector or pulley system 173, e.g., a string, wire, chain, rope, composite, or the like. As shown, roller portions 171a,b each comprise: a mass 174; an axle (not shown) about which mass 174 is configured to rotate; a circumferential component 175; a plurality of spokes 176, each rotatably connecting mass 174 to circumferential component 175, at least one of spokes 176 comprising an electroactive polymer, wherein: at least one of spokes 176 has at least one input electrode (not shown; however, for purposes of FIG. 17, each of spokes 176 should be considered to have a corresponding input electrode), and is configured to bend upon application of an electrical potential across the input electrode(s). Likewise, each of spokes 176 may be configured to straighten upon discontinuing application of an electrical potential across the input electrode(s). Roller portions 171a,b are further configured such that the deflection of at least one of spokes 176 causes mass 174 to move, thereby causing roller portions 171a,b to become off balance with respect to gravity. The return of mass 174 to an equilibrium position, under the force of gravity, causes rotary motion (that is, spinning of roller portions 171a,b) about their respective axles.

As shown, robotic arm 172 is rotatable about pin 178. Thus, the choreographed rotation of roller portions 171a,b as described above causes roller portions 171a,b to turn continuously. As roller portions 171a,b turn, driven by the circular motion, and, e.g., friction, meshing gear teeth, or the like, robotic arm 172 rotates about pin 178. In another embodiment, roller portions 171a,b are configured to oscillate at a desired rate (i.e., turn partially one direction, then the other, rather than turn continuously in a single direction), therein causing robotic arm 172 to rotate either clockwise or counterclockwise at any frequency and rate desired.

EAP Power Supplies

In various embodiments described herein, the power source to apply voltage across the actuators to cause displacement of the center mass of the roller may include a battery contained in the center mass. See FIG. 1. Other power sources may be suitable, including fuel and oxidizers, as described in Baughman, R. H., Fuel-Powered Actuators, 2006, and Ebron, V. H.; Yang, Z.; Seyer, D. J.; Kozlov, M. E.; Oh, J.; Xie, H.; Razal, J.; Hall, L. J.; Ferraris, J. P.; MacDiarmid, A. G.; Baughman, R. H., Fuel-Powered Artificial Muscles. Science 2006, 311, 1580-83, both of which are incorporated herein by reference in their entireties. In the case of fuel and/or oxidizer-powered actuators, the device may be divided into chambers. In the chambers, the actuator material is exposed to a fuel and/or oxidizing agent, thereby causing actuation and/or reversal of the actuation of the actuator. These types of actuators can simultaneously function as a muscle, a fuel cell electrode, and a supercapacitor electrode.

Figure 18:
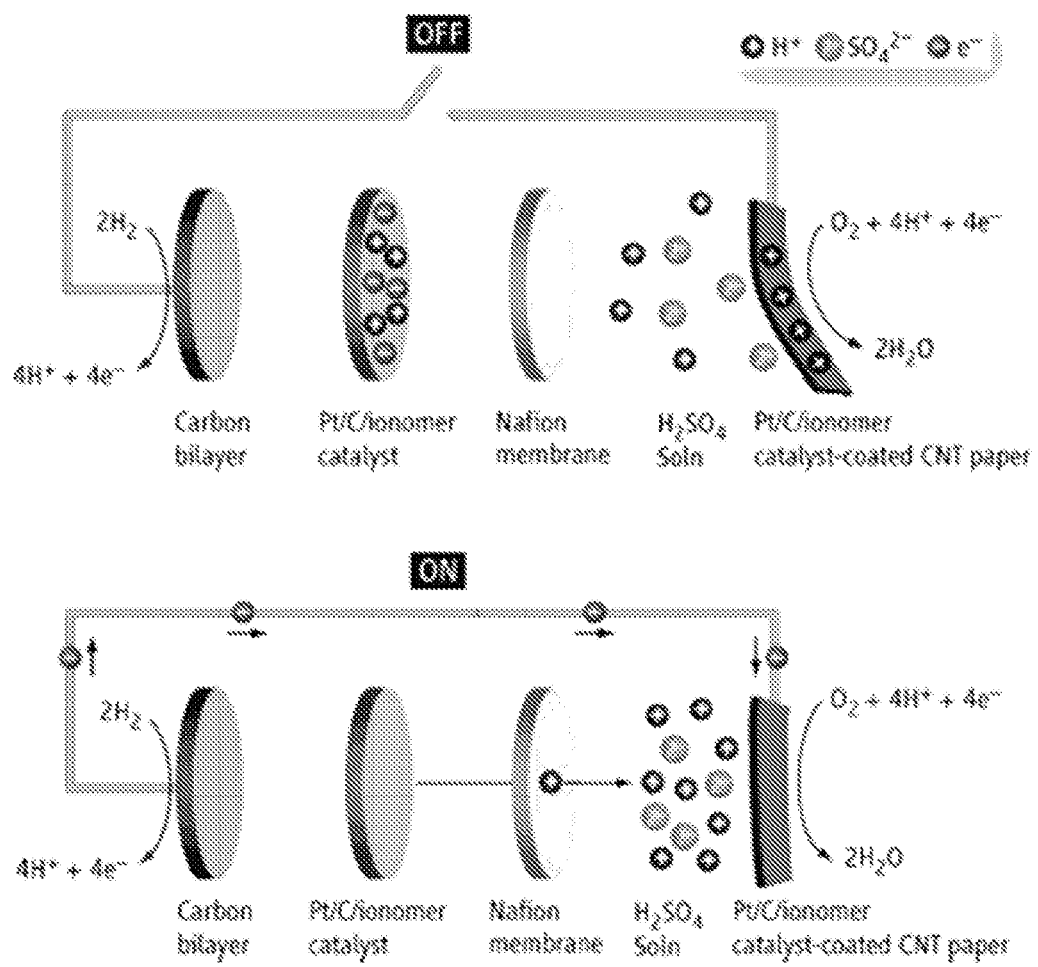
FIG. 18 illustrates a schematic of an example fuel powered artificial muscle.

A schematic of a fuel powered artificial muscle is shown in FIG. 18. As shown in the top portion of FIG. 18, oxygen dissolved in water transfers charge (assisted by the platinum catalyst) to paper made of carbon nanotubes. The nanotube film expands as a result of the charging, causing the film to bend as it expands relative to the platinum/carbon/ionomer layer. As shown in the bottom portion of FIG. 18, the bending is reversed by closing the circuit to a hydrogen electrode, which neutralizes the charge. The counter electrode is a carbon bilayer-platinum catalyst-Nafion membrane electrode assembly. See Madded, J. D., Artificial Muscle Begins to Breathe. Science 2006, 311, 1559-60, incorporated herein by reference in its entirety.

To the extent that the term "includes" or "including" is used in the specification or the claims, it is intended to be inclusive in a manner similar to the term "comprising" as that term is interpreted when employed as a transitional word in a claim. Furthermore, to the extent that the term "or" is employed (e.g., A or B) it is intended to mean "A or B or both." When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995). Also, to the extent that the terms "in" or "into" are used in the specification or the claims, it is intended to additionally mean "on" or "onto," and vice-versa. Furthermore, to the extent the term "connect," or any form of that term, is used in the specification or claims, it is intended to mean not only "directly connected to," but also "indirectly connected to" such as connected or contacted through another component or components, and is meant to include a rotatable or dynamic connection, as well as a fixed or static connection, even if not explicitly stated in every instance. In some embodiments, "connected" means "operatively connected," that is, that one object is arranged with respect to another object in a manner capable of performing a desired function.

As stated above, while the present application has been illustrated by the description of embodiments thereof, and while the embodiments have been described in considerable detail, it is not an intention to restrict or in any way limit the scope of the appended claims to such detail. With the benefit of the present application, additional advantages and modifications will readily appear to those skilled in the art. Therefore, the application, in its broader aspects, is not limited to the specific details, the representative apparatuses, and illustrative examples shown and described. Accordingly, departures may be made from such details without departing from the spirit or scope of the general inventive concept.

What is claimed is:

1. A rotary motion device, comprising:
   a mass;
   a circumferential component; and
   a plurality of spokes connecting the mass and the circumferential component, at least one of the spokes comprising an electroactive polymer, the at least one spoke comprising at least one input electrode, the at least one spoke being configured to deflect upon application of an electrical potential across the at least one input electrode, and
   the plurality of spokes, the mass, and the circumferential component being operatively coupled in the rotary motion device such that deflection of the at least one spoke moves the mass to position the rotary motion device in an off balance state with respect to gravity, the off balance state being effective to cause rotation of the rotary motion device, the rotary motion device in the absence of one or more of: a motor crank arm and a motor shaft.

2. The rotary motion device of claim 1, wherein the electroactive polymer comprises an ionic electroactive polymer.

3. The rotary motion device of claim 1, wherein the electroactive polymer comprises an ionic polymer metal composite.

4. The rotary motion device of claim 1, wherein the mass is configured to support a payload.

5. The rotary motion device of claim 1, wherein the plurality of spokes extend in a two dimensional plane and the circumferential component forms a wheel.

6. The rotary motion device of claim 1, wherein the plurality of spokes extend in three dimensions and the circumferential component forms a sphere.

7. The rotary motion device of claim 1, further comprising an axle about which the mass is configured to rotate.

8. The rotary motion device of claim 7, wherein the circumferential component includes a plurality of blades extending outwardly.

9. The rotary motion device of claim 7, wherein the circumferential component includes at least one gear tooth.

10. The rotary motion device of claim 7, wherein the circumferential component comprises a pin and a crescent guard, and further comprising a cross comprising at least one recess configured to receive the pin.

11. The rotary motion device of claim 7, further comprising a cam follower configured to trace a surface of the circumferential component, wherein the rotation of the circumferential component causes the cam follower to trace the surface of the circumferential component and transmit the rotation of the circumferential component to a mechanism.

* * * * *